(12) United States Patent
Lu

(10) Patent No.: US 10,461,005 B2
(45) Date of Patent: Oct. 29, 2019

(54) SEMICONDUCTOR PACKAGE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/943,334

(22) Filed: Apr. 2, 2018

(65) Prior Publication Data

US 2019/0304862 A1    Oct. 3, 2019

(51) Int. Cl.
| | |
|---|---|
| *H01L 23/31* | (2006.01) |
| *H01L 21/56* | (2006.01) |
| *H01L 23/538* | (2006.01) |

(52) U.S. Cl.
CPC ............. *H01L 23/31* (2013.01); *H01L 21/56* (2013.01); *H01L 23/5389* (2013.01); *H01L 2224/0401* (2013.01); *H01L 2224/04105* (2013.01); *H01L 2224/131* (2013.01); *H01L 2224/32151* (2013.01)

(58) Field of Classification Search
CPC ..... H01L 23/31; H01L 21/56; H01L 23/5389; H01L 2224/0401; H01L 2224/04105
USPC .......................................................... 257/678
See application file for complete search history.

(56) References Cited

U.S. PATENT DOCUMENTS

| | | | |
|---|---|---|---|
| 2007/0069363 A1 | 3/2007 | Kawabata et al. | |
| 2014/0131858 A1* | 5/2014 | Pan ................... | H01L 24/13 257/737 |
| 2015/0137351 A1* | 5/2015 | Cheng ................ | H01L 23/562 257/737 |

FOREIGN PATENT DOCUMENTS

TW           200721419         6/2007

* cited by examiner

*Primary Examiner* — Elias Ullah
(74) *Attorney, Agent, or Firm* — Foley & Lardner LLP; Cliff Z. Liu

(57) ABSTRACT

A semiconductor package includes a dielectric layer and a conductive post. The dielectric layer has a first surface and a second surface opposite to the first surface. The conductive post is disposed in the dielectric layer. The conductive post includes a first portion and a second portion disposed above the first portion. The second portion of the conductive post is recessed from the second surface of the dielectric layer.

18 Claims, 53 Drawing Sheets

SEMICONDUCTOR PACKAGE

BACKGROUND

1. Technical Field

The present disclosure relates to a semiconductor package and a method for manufacturing the same.

2. Description of the Related Art

A semiconductor package may include a conductive post encapsulated by an encapsulant. To provide electrical connection, the conductive post, which is encapsulated by the encapsulant, is exposed by removing the encapsulant (e.g. by a grinding technique) and a circuit layer may be formed on the conductive post. However, the relatively small roughness of the conductive post (which may result from using the grinding technique) may lead to cracks or delamination between the circuit layer and the conductive post.

Moreover, particles of the conductive post may remain on the encapsulant subsequent to the grinding operation, and particles of the encapsulant may remain on conductive post the subsequent to the grinding operation.

SUMMARY

In one or more embodiments, a semiconductor package includes a first dielectric layer and a conductive post. The first dielectric layer has a first surface and a second surface opposite to the first surface. The conductive post is disposed in the first dielectric layer. The conductive post includes a first portion and a second portion disposed above the first portion. The second portion of the conductive post is recessed from the second surface of the first dielectric layer.

In one or more embodiments, a method for manufacturing a semiconductor package includes providing a conductive post; forming a sacrificial element on the conductive post; encapsulating the sacrificial element and the conductive post by an encapsulant; and removing a top portion of the encapsulant and the sacrificial element to expose the conductive post such that a top surface of a remaining portion of the encapsulant is rough.

BRIEF DESCRIPTION OF THE DRAWINGS

Common reference numerals are used throughout the drawings and the detailed description to indicate the same or similar elements. Embodiments of the present disclosure will be readily understood from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
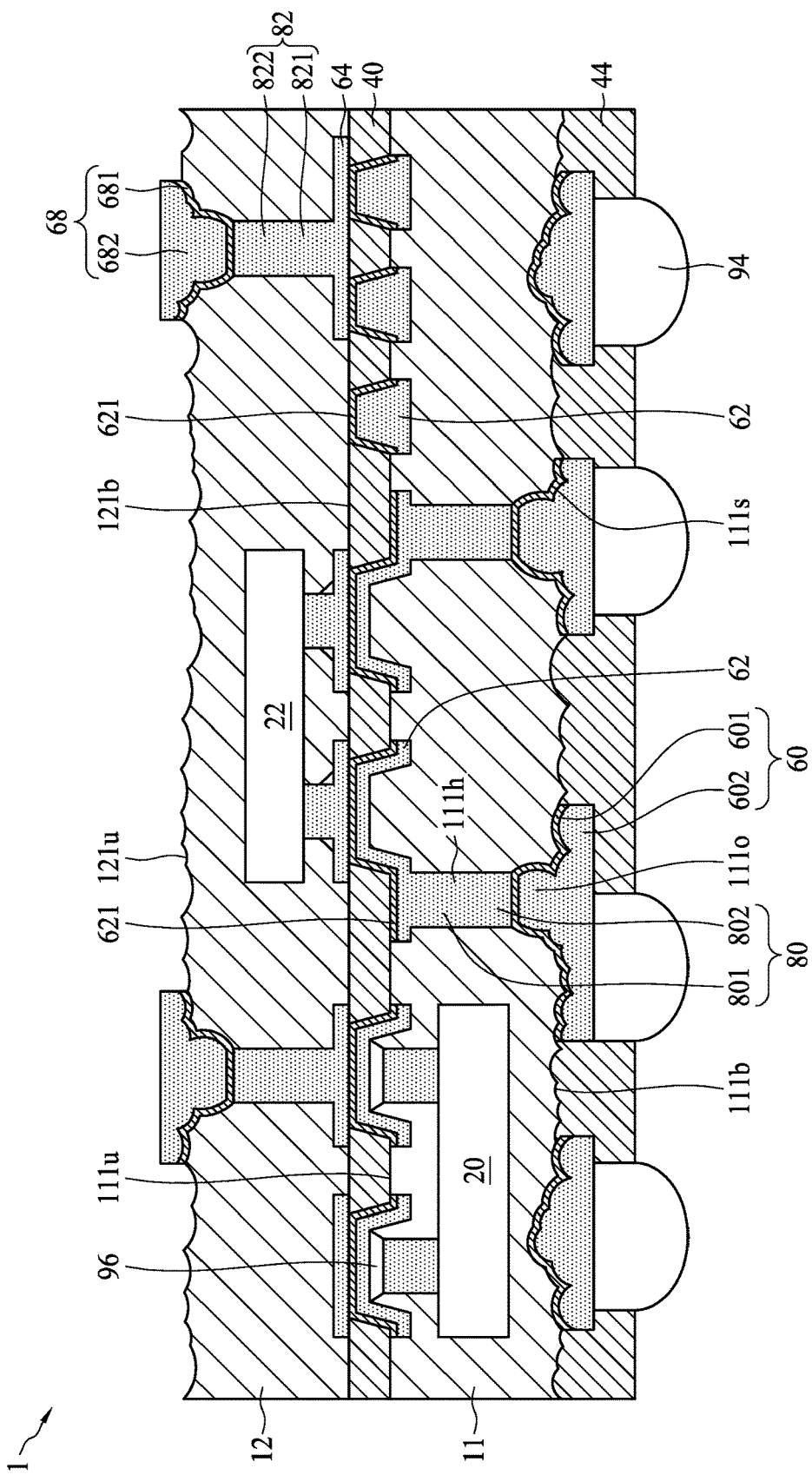
FIG. 1 is a cross-sectional view of a semiconductor package in accordance with some embodiments of the present disclosure.

FIG. 1 is a cross-sectional view of a semiconductor package 1 in accordance with some embodiments of the present disclosure. The semiconductor package 1 includes dielectric layers 11 and 12, electrical components 20 and 22, insulation layers (or passivation layers) 40 and 44, patterned conductive layers 60, 62, 64 and 68, conductive posts 80 and 82, and solder 94.

In one or more embodiments, the electronic components 20 and 22 may be chips or dies. The dielectric layer 11 has a surface 111*u* and a surface 111*b* opposite to the surface 111*u*. The dielectric layer 12 has a surface 121*u* and a surface 121*b* opposite to the surface 121*u*. The conductive post 80 is disposed in the dielectric layer 11. In some embodiments, a material of the conductive post 80 may include, for example, copper (Cu), another metal, an alloy, or other suitable conductive materials. In some embodiments, the solder 94 may be a solder bump.

The conductive post 80 includes a first portion 801 and a second portion 802 below the first portion 801. The second portion 802 of the conductive post 80 is recessed from the surface 111b of the dielectric layer 11. The dielectric layer 11 defines a tapered opening 111o adjacent to the second portion 802 of the conductive post 80. In one or more embodiments, a thickness of one or more of the dielectric layers 11 and 12 is in a range of about 120 micrometers (μm) to about 150 μm.

The patterned conductive layer 60 is extended into the tapered opening 111o and is in contact with the second portion 802 of the conductive post 80. The patterned conductive layer 62 is electrically connected to the second portion 801 of the conductive post 80. The height of the conductive post 80 is in a range from approximately 20 μm to approximately 70 μm. In some embodiments, the semiconductor package 1 includes a plurality of conductive posts 80 having a line width/line space (L/S) less than about 5 μm/about 5 μm (e.g. about 4 μm/about 4 μm or less, or about 3 μm/about 3 μm or less).

The patterned conductive layer 60 includes a sublayer 601 and a sublayer 602. In some embodiments, the sublayer 601 may be a seed layer. In one or more embodiments, a material of the sublayer 601 may include, for example, Cu, titanium (Ti), a titanium-copper alloy (Ti/Cu), another metal, another alloy, or other suitable conductive materials. In some embodiments, a material of the sublayer 602 may include, for example, Cu, another metal, an alloy, or other suitable conductive materials.

The sublayer layer 601 is disposed between the sublayer 602 and the second portion 802 of the conductive post 80. The patterned conductive layer 62 includes a sublayer 621. The sublayer 621 of the patterned conductive layer 62 includes Ti. In one or more embodiments, a material of the sublayer 621 may include, for example, Cu, Ti, a titanium-copper alloy (Ti/Cu), another metal, another alloy, or other suitable conductive materials.

The electrical component 20 is embedded in the dielectric layer 11 and disposed between the patterned conductive layer 60 and the patterned conductive layer 62. The dielectric layers 11 and 12 include one or more molding materials. The molding material/encapsulant/molding compound of the dielectric layers 11 and 12 includes, for example, resin and/or filler/particles.

The surface 111b of the dielectric layer 11 has an Ra (arithmetic average surface roughness) value. In one or more embodiments, the Ra value is at least or greater than approximately 450 nanometers (nm). In one or more embodiments, the Ra value is up to or less than approximately 12 The dielectric layer 11 has a sidewall 111s. The sidewall 111s defines the tapered opening 111o adjacent to the second portion 802 of the conductive post 80. The sidewall 111s of the dielectric layer 11 has a surface roughness substantially the same as the surface roughness of the surface 111b of the dielectric layer 11. In one or more embodiments, the Ra value of the surface 111b of the dielectric layer 11 is in a range from approximately 3 μm to approximately 10 In one or more embodiments, the Ra value of the surface 111b of the dielectric layer 11 is in a range from approximately 0.5 μm to approximately 12 μm. The largest height difference between portions of the surface 111b of the dielectric layer 11 is in a range from approximately 10 μm to approximately 20 The surface roughness of the surface 111b of the dielectric layer 11 (e.g. greater than 450 nm) may have enough bonding force to avoid cracks at an interface between a circuit layer and a surface of the conductive post 80 (e.g. a surface 80u of the conductive post 80 described below). The surface roughness of the surface 111b of the dielectric layer 11 (e.g. which may be in a range from about 3 μm to about 10 μm) may provide improved adhesion due to the increased surface area. The surface 111b of the dielectric layer 11 may be roughened by dry sandblasting or wet sandblasting. The surface 111b of the dielectric layer 11 may be roughened by low temperature sandblasting, using a sacrificial metal including tin (Sn) that becomes brittle at a temperature in a range from about −30 degrees Celsius (° C.) to about 13° C. After thinning the dielectric layer 11 and roughening the surface 111b of the dielectric layer 11, the surface roughness of a surface of the conductive post 80 may be in a range from about 0.1 μm to about 0.4 μm.

Figure 2A:
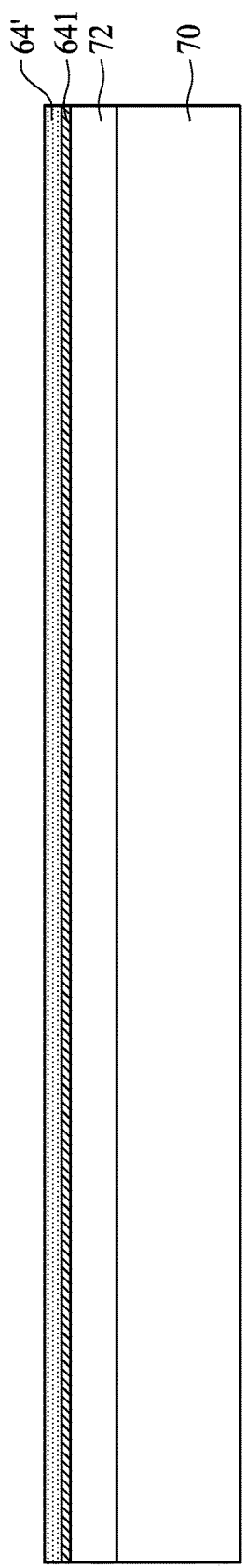
FIG. 2A, FIG. 2B, FIG. 2C, FIG. 2D, FIG. 2E, FIG. 2F, FIG. 2G FIG. 2H, FIG. 2I, FIG. 2J, FIG. 2K, FIG. 2L, FIG. 2M, FIG. 2N, FIG. 2O, FIG. 2P, and FIG. 2Q illustrate a method for manufacturing a portion of the semiconductor package shown in FIG. 1 in accordance with some embodiments.
Figure 2B:
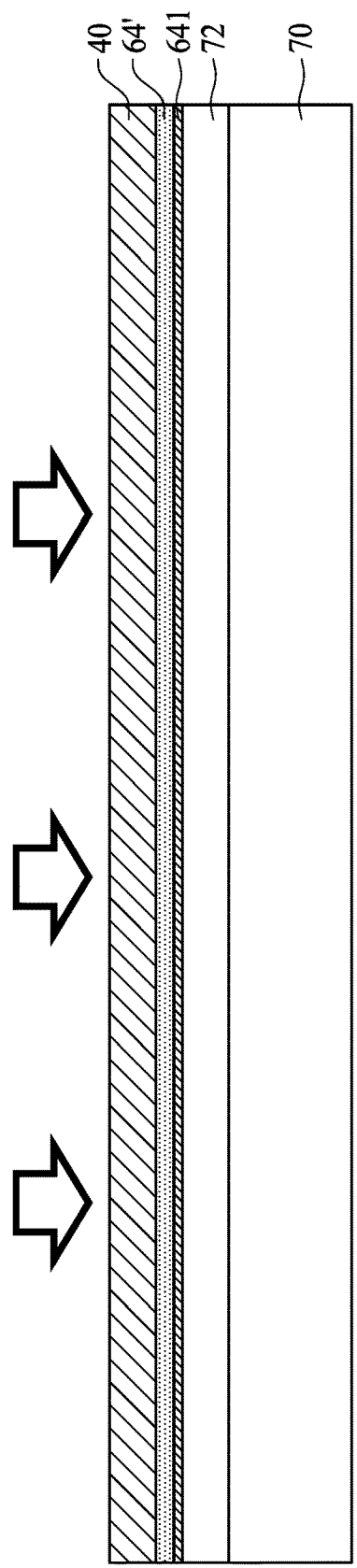
Figure 2C:
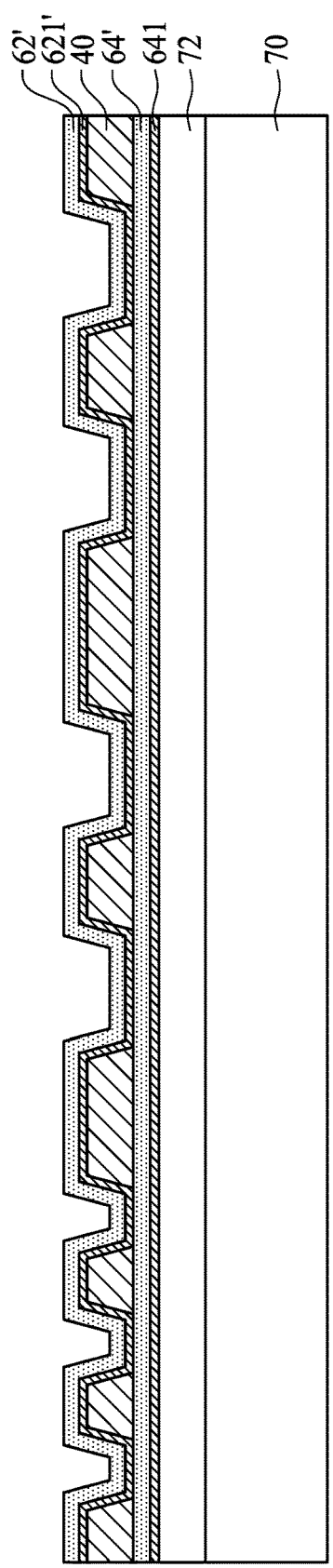
Figure 2D:
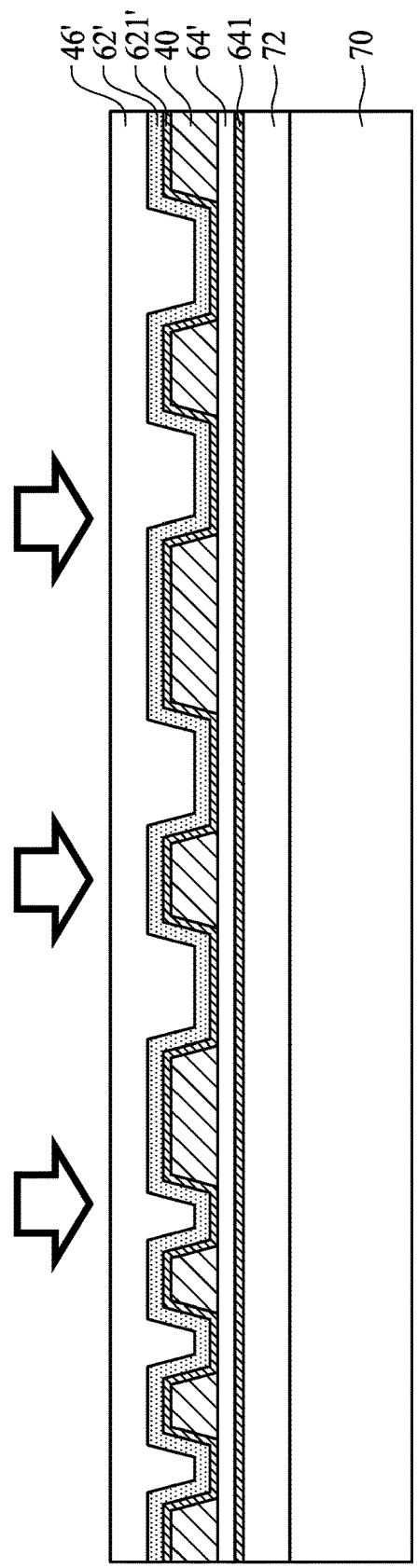
Figure 2E:
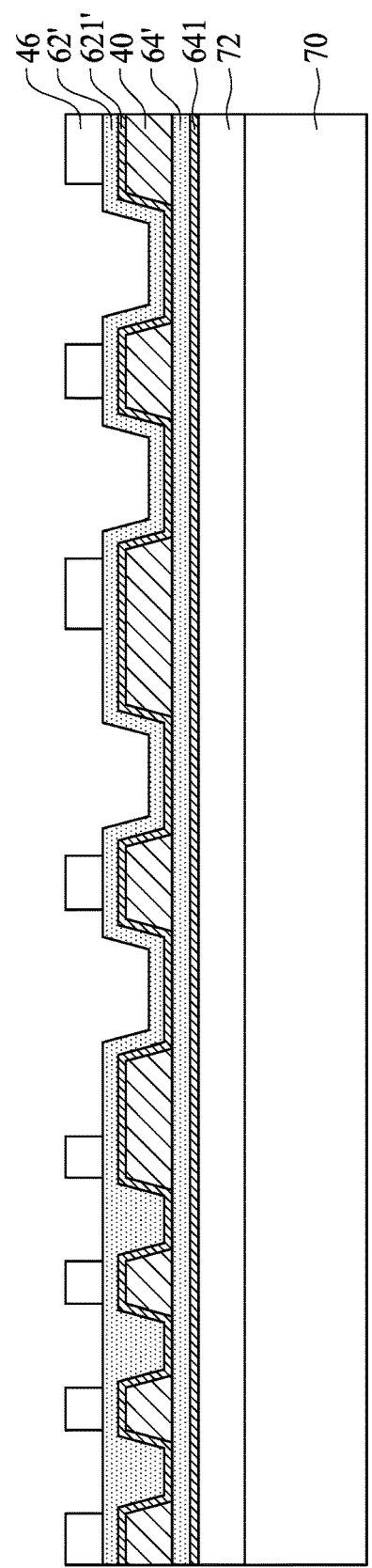
Figure 2F:
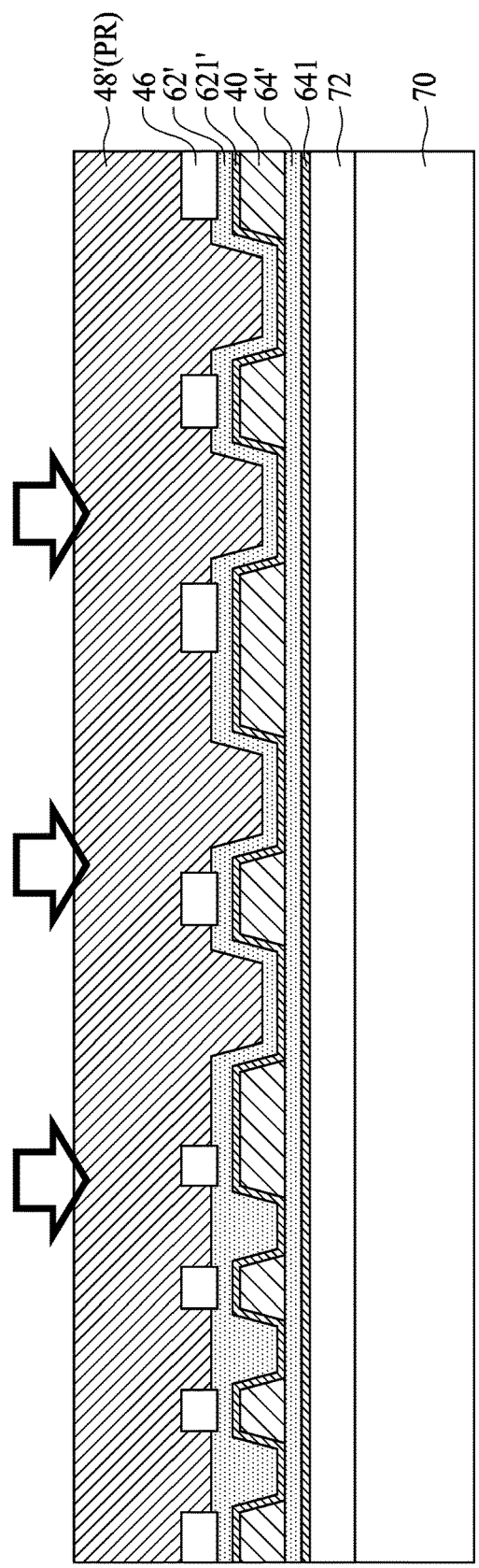
Figure 2G:
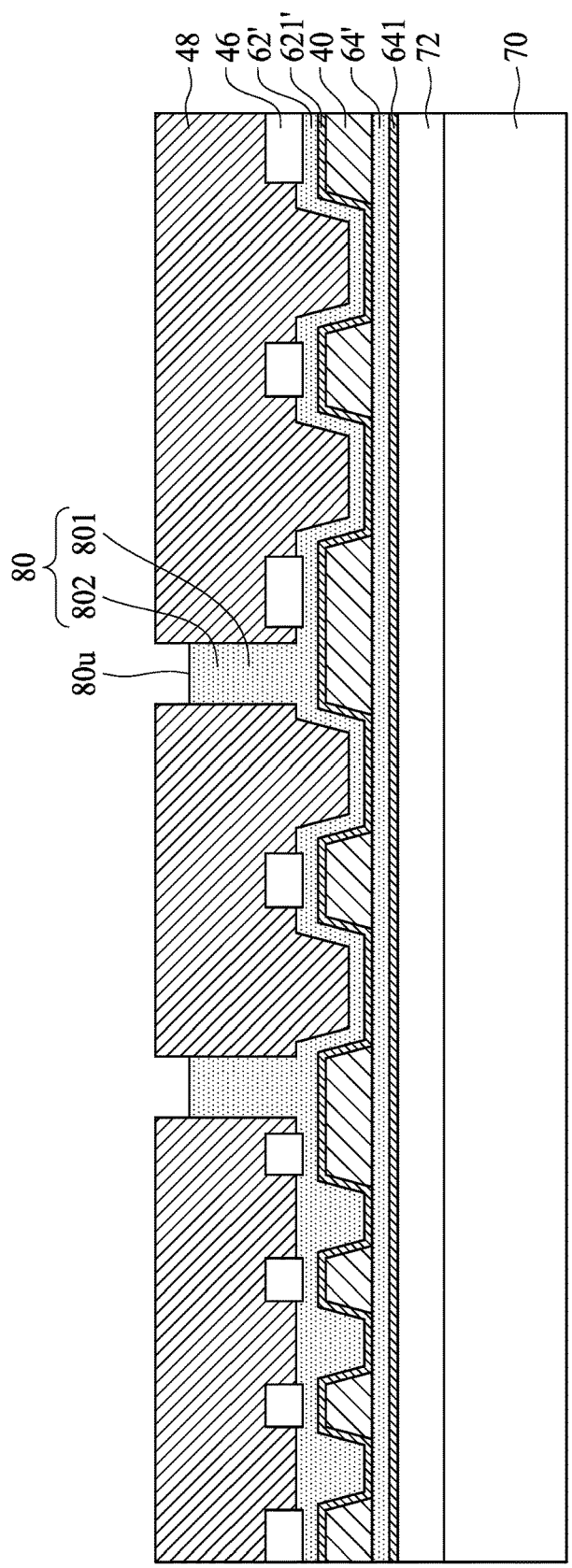
Figure 2H:
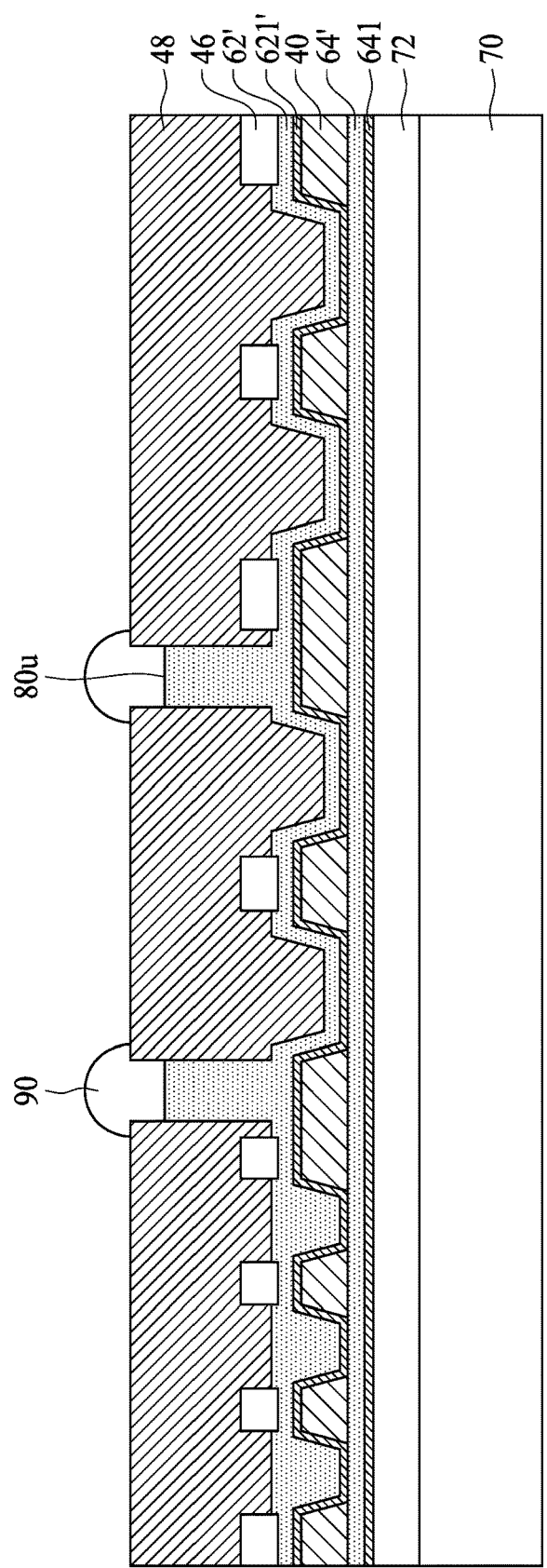
Figure 2I:
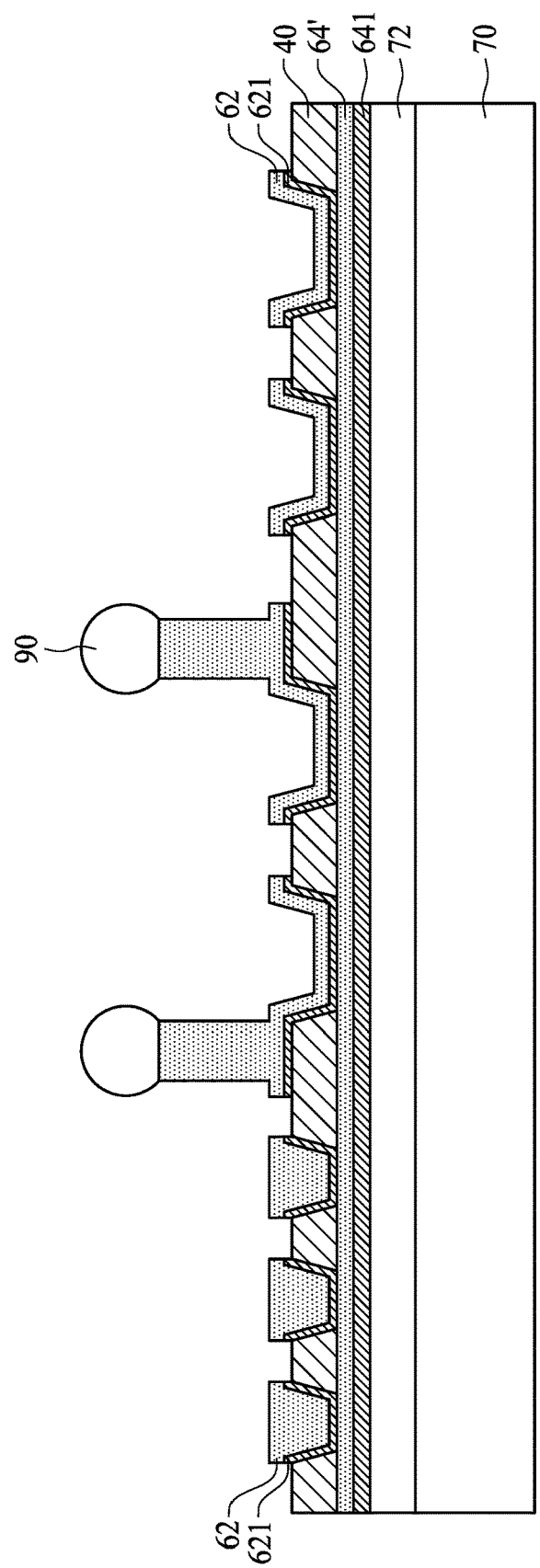
Figure 2J:
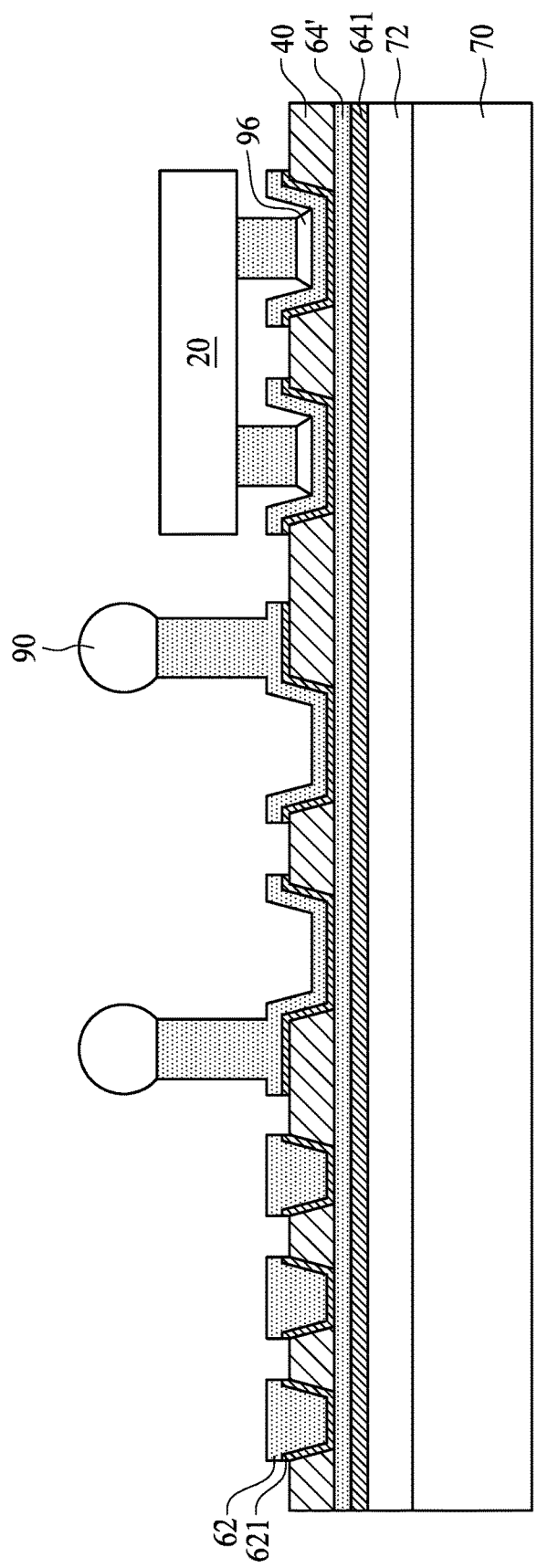
Figure 2K:
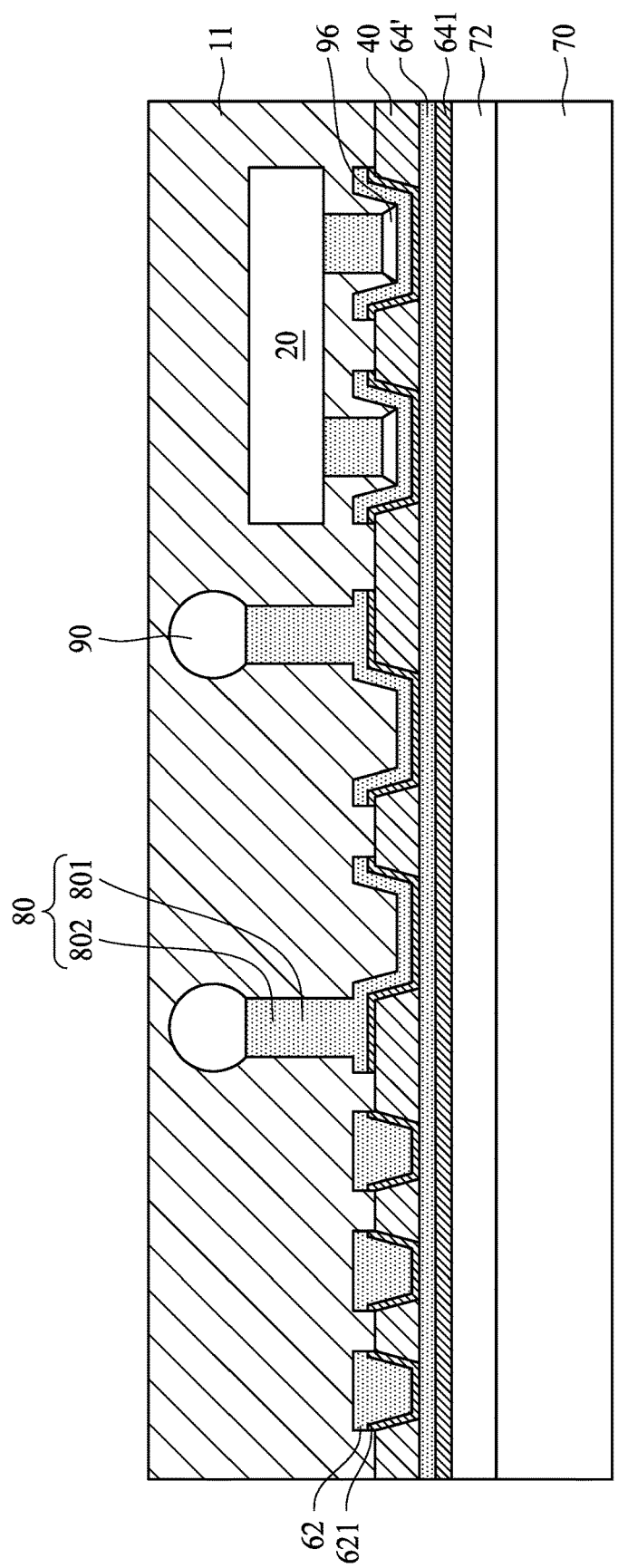
Figure 2L:
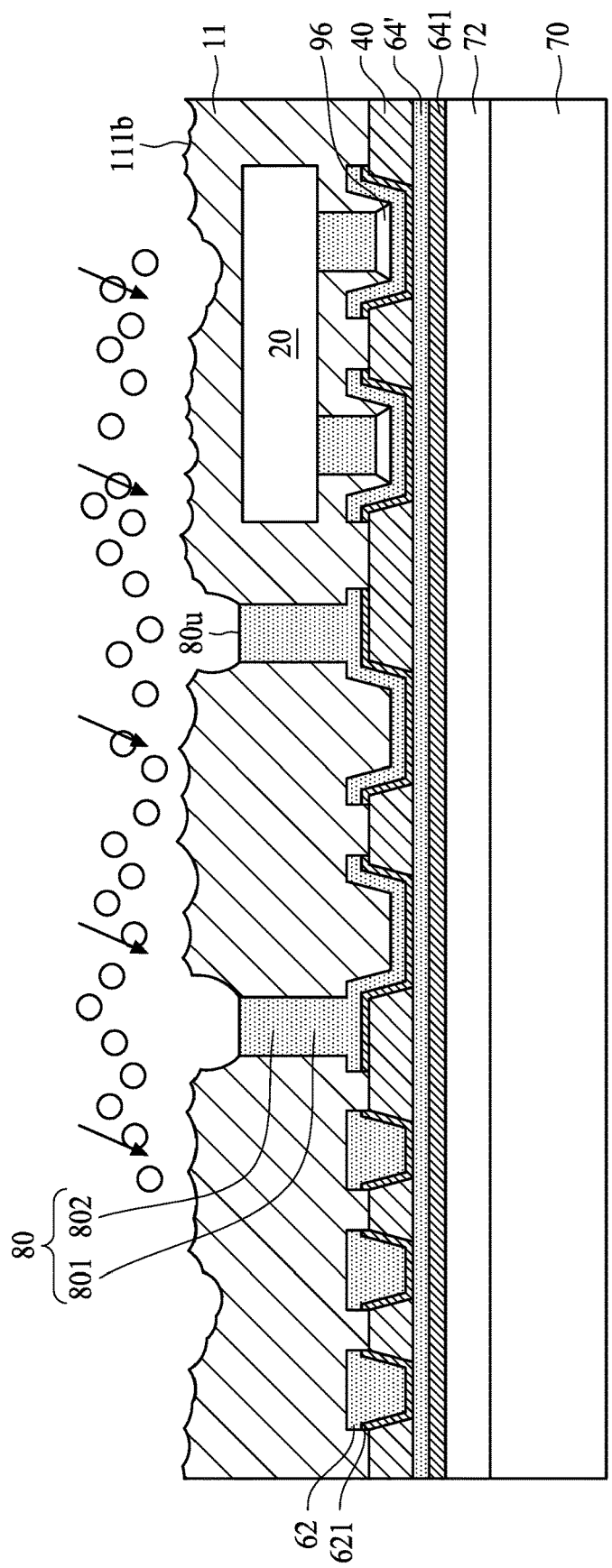
Figure 2M:
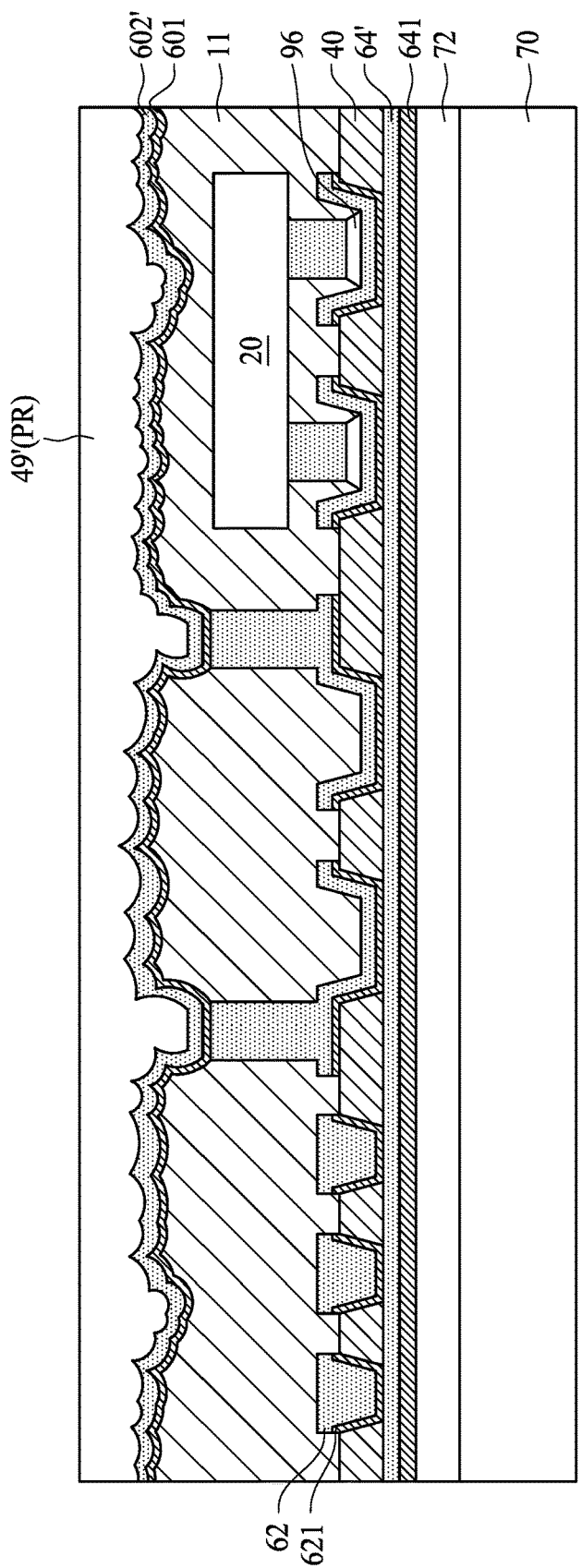
Figure 2N:
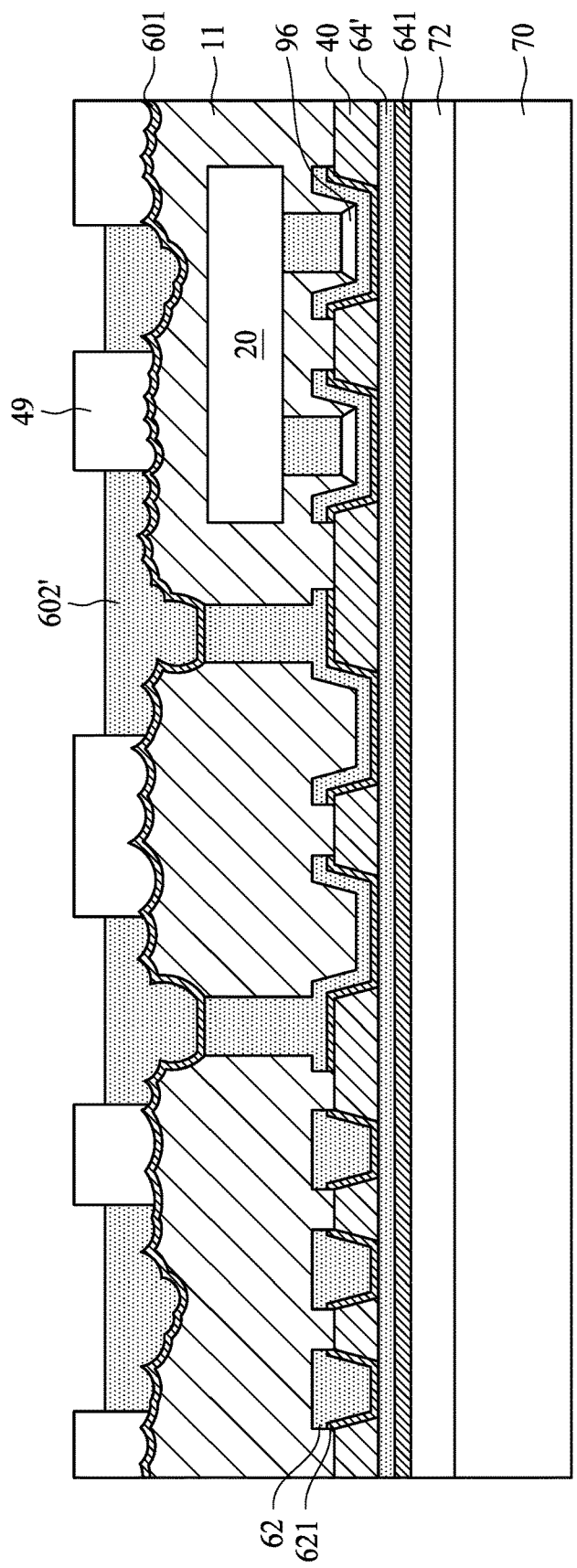
Figure 2O:
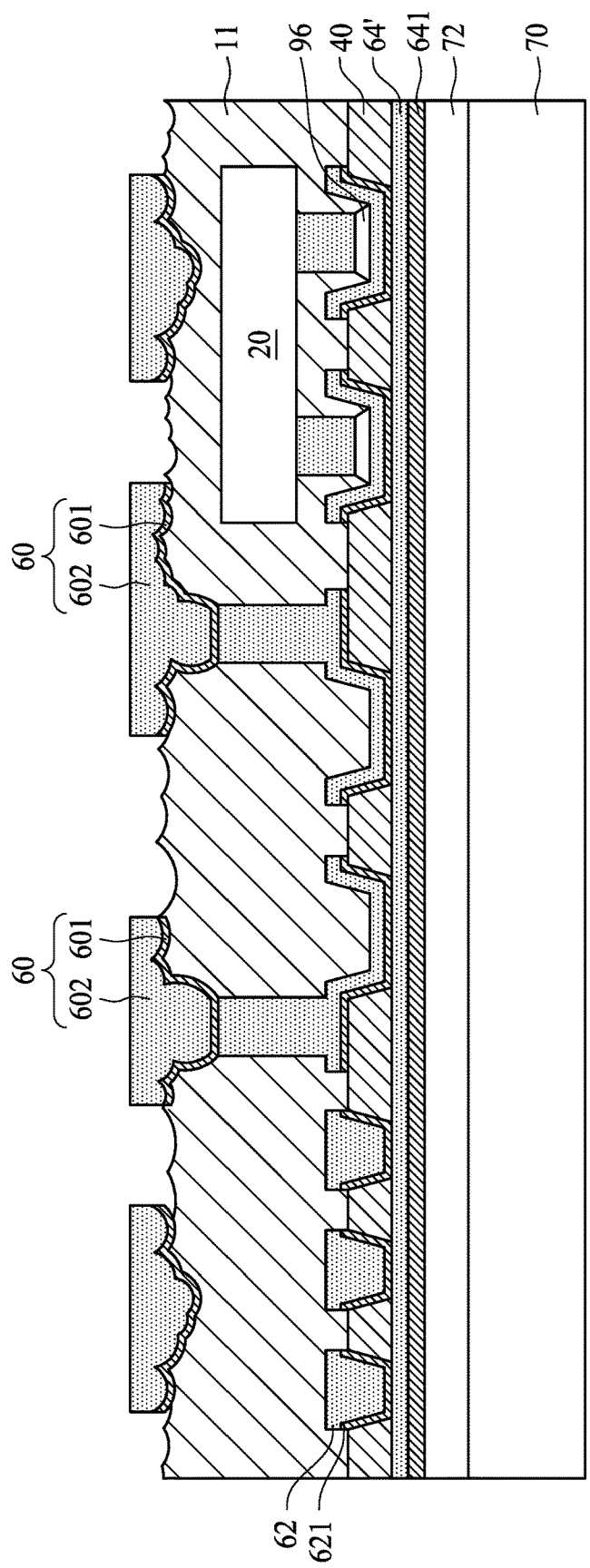
Figure 2P:
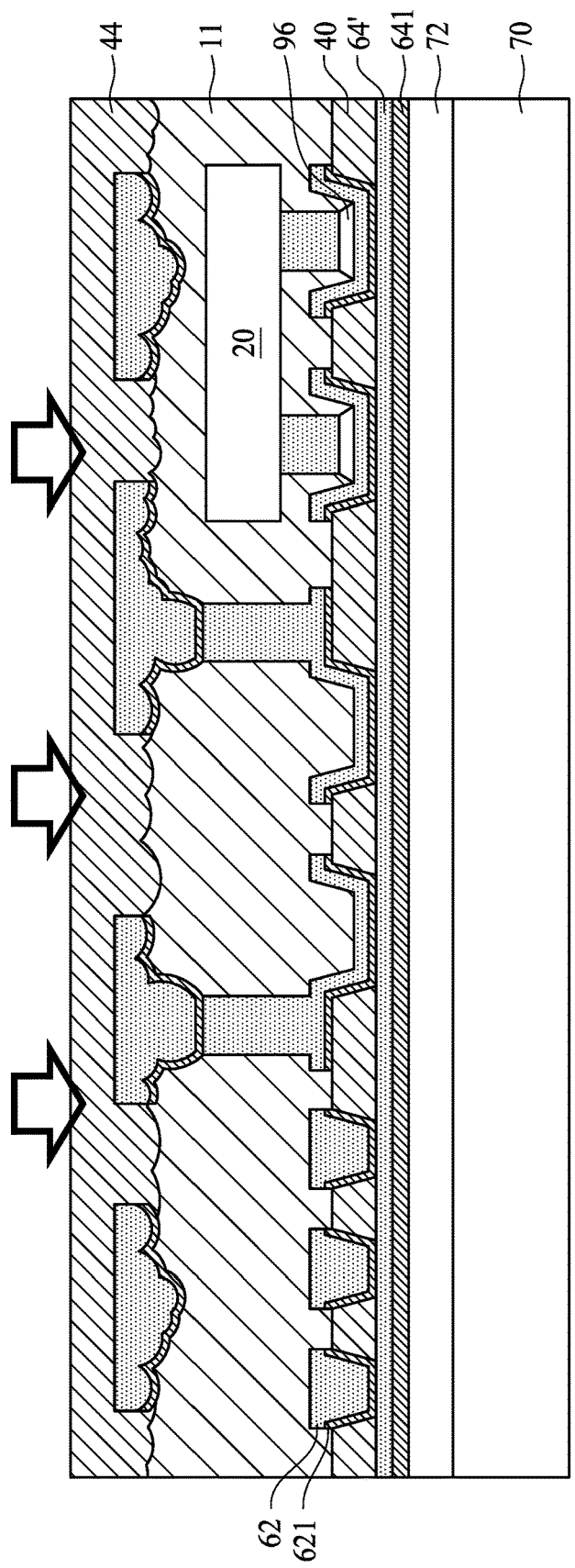
Figure 2Q:
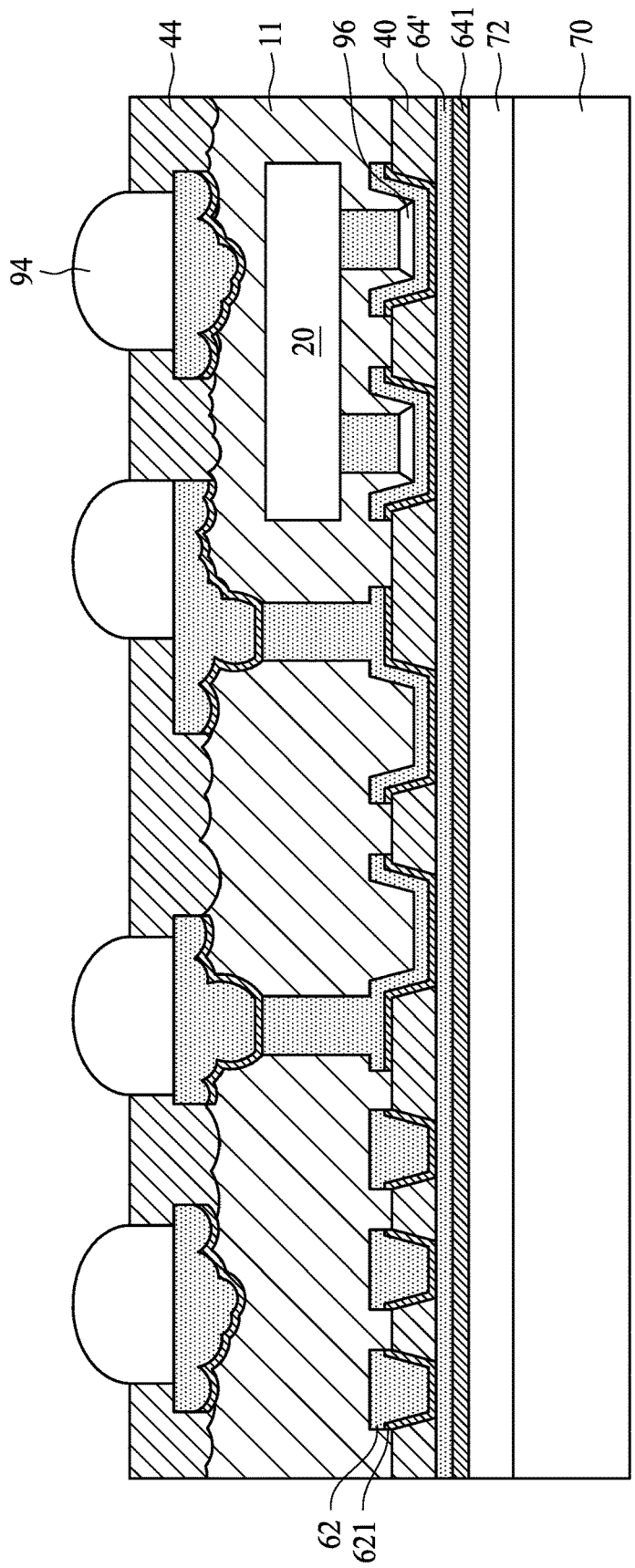

FIG. 2A through FIG. 2Q illustrate a method for manufacturing a portion 1' of the semiconductor package 1 as shown in FIG. 1 in accordance with some embodiments. Referring to FIG. 2A, a carrier 70 including a release layer 72 is provided. A sublayer 641 and a patterned conductive layer 64' are formed or provided on a top surface of the release layer 72. In some embodiments, the carrier 70 may include organic materials (e.g., a molding compound, bis-maleimide triazine (BT), a polyimide (PI), polybenzoxazole (PBO), a solder resist, an Ajinomoto build-up film (ABF), a polypropylene (PP) or an epoxy based material) and/or inorganic materials (e.g., silicon, a glass, a ceramic or quartz).

Referring to FIG. 2B, a passivation layer 40 is formed on the patterned conductive layer 64'. In some embodiments, the passivation layer 40 includes a suitable insulating material. For example, the passivation layer 40 may include a silicon nitride (SiN$_x$) film; however, other suitable materials may be additionally or alternatively used. In one or more embodiments, a thickness of the passivation layer 40 is in a range of about 10 μm to about 20 μm.

Referring to FIG. 2C, a portion of the passivation layer 40 is removed by etching. A sublayer 621' and a patterned conductive layer 62' are formed the patterned conductive layer 64' and passivation layer 40. In some embodiments, a material of the patterned conductive layer 62' may include, for example, Cu, another metal, an alloy, or other suitable conductive materials. In some embodiments, a material of the sublayer 621' may include, for example, Cu, Ti, a titanium-copper alloy (Ti/Cu), another metal, another alloy, or other suitable conductive materials.

Referring to FIG. 2D, a photoresist layer 46' is formed by coating. In one or more embodiments, a material of the photoresist layer 46' may include, for example, a photosensitive material, a positive polyimide, a positive photoresist or other suitable materials.

Referring to FIG. 2E, a patterned photoresist layer 46 is formed using a photolithography etching operation (e.g. to pattern the photoresist layer 46'). A portion of the patterned conductive layer 62' is exposed. The thickness of the exposed portion of the patterned conductive layer 62' is increased by plating.

Referring to FIG. 2F, a photoresist layer 48' is formed by coating. In one or more embodiments, a material of the photoresist layer 48' may include, for example, a photosensitive material, a positive polyimide, a positive photoresist or other suitable materials.

Referring to FIG. 2G a portion of a patterned photoresist layer 48 is formed using a photolithography etching operation. A conductive post 80 is formed in the patterned photoresist layer 48. The conductive post 80 has a top surface 80u (which may be a bottom surface of the conductive post 80 in the orientation shown in FIG. 1). The conductive post 80 has a first portion 801 and a second portion 802 disposed above the first portion 801. The second portion 802 of the conductive post 80 is recessed from the top surface of the patterned photoresist layer 48. In some embodiments, the conductive post 80 is a monolithic structure, and the first portion 801 and the second portion 802 are integrally formed with one another without a detectable interface in between.

Referring to FIG. 2H, a sacrificial element 90 is formed on the top surface 80u of the conductive post 80. The sacrificial element 90 may include Sn.

Referring to FIG. 2I, the patterned photoresist layers 46 and 48 are removed by etching. A portion of the patterned conductive layer 62' and sublayer 621' are removed by etching. After etching, the patterned conductive layer 62 and sublayer 621 are formed. A heating operation is performed to reflow the sacrificial element 90. The sacrificial element 90 contains Sn in an amount greater than about 90 percent by weight (wt %), such as about 92 wt % or more, or about 94 wt % or more. The melting point of the sacrificial element 90 is lower than the melting point of the conductive post 80 (e.g. by about 10° C. or more, about 30° C. or more, or about 50° C. or more).

Referring to FIG. 2J, an electrical component 20 is bonded to the patterned conductive layer 62. The electrical component 20 may be bonded to the patterned conductive layer 62 via a bonding component 96, such as an adhesive or a solder element.

Referring to FIG. 2K, a dielectric layer 11 is formed to encapsulate the electrical component 20, the conductive post 80 and the sacrificial element 90. The dielectric layer 11 may include a molding material, an encapsulant or a molding compound. The molding material/encapsulant/molding compound may include a resin and/or fillers/particles.

Referring to FIG. 2L, a portion of the dielectric layer 11 is removed using a compressed nitrogen gas at a temperature equal to or lower than about 13° C. (e.g. equal to or lower than about 8° C., equal to or lower than about 3° C., or equal to or lower than about −2° C.) to perform a sandblasting process using a powder including particles that have respective widths between about 2 μm and about 10 The powder includes one or more of a ceramic (e.g. a silicon carbide, an oxide such as aluminum oxide as contained in emery, or a glass), steel, iron, or a resin (e.g. a plastic). In some embodiments, a portion of the dielectric layer 11 is removed by sandblasting the powder on to the dielectric layer 11 using high pressure nitrogen gas at a temperature equal to or lower than about −20° C. (e.g. equal to or lower than about −25° C., equal to or lower than about −30° C., or equal to or lower than about −35° C.). In some embodiments, the pressure of the nitrogen gas is in a range between about 2 kilograms per centimeter squared (kg/cm$^2$) to about 10 kg/cm$^2$. The sandblasting may form a rough surface 111b having a surface profile with peaks and with indentations having sizes comparable to sizes of particles used for sandblasting. In some embodiments, removing a portion of the dielectric layer 11 may include a grinding operation, dry sandblasting and/or wet sandblasting. After grinding, the surface roughness of the surface 111b of the dielectric layer 11 may be at least or greater than about 450 nm (e.g. may be about 500 nm or more, about 550 nm or more, or about 600 nm or more). The sacrificial element 90 may be removed to expose the conductive post 80. Removing the sacrificial element 90 and exposing the conductive post 80 includes melting the sacrificial element 90 by a heating operation. Removing the sacrificial element 90 may expose a tapered opening 111o defined by the dielectric layer 111 that exposes the top surface 80u of the conductive post 80. The surface roughness of the rough surface 111b of the dielectric layer 11 may be substantially the same as a surface roughness of a sidewall of the tapered opening 111o. In some embodiments, the surface roughness of the top surface 80u of the conductive post 80 is in a range from about 0.1 μm to about 0.4 The sacrificial element 90 may be removed by performing a heating operation to melt the sacrificial element 90. The conductive post 80 may include conductive material (e.g. Cu) that is highly ductile and the low temperature sandblasting may not substantially damage or deform the conductive post 80.

Referring to FIG. 2M, a sublayer 601 and a conductive layer 602' are formed on a top surface of the dielectric layer 11. Next, a photoresist layer 49' is formed by coating. In one or more embodiments, a material of the photoresist layer 49' may include, for example, a photosensitive material, a positive polyimide, a positive photoresist or other suitable materials.

Referring to FIG. 2N, a portion of the photoresist layer 49' is removed by photolithography etching to form the patterned photoresist layer 49. A portion of the conductive layer 602' is exposed.

Referring to FIG. 2O, the patterned photoresist layer 49 is removed. The top surface of the dielectric layer 11 is exposed. A patterned conductive layer 60 including the sublayer 601 and the conductive layer 602' (hereinafter referred to as the sublayer 602') is thus formed.

Referring to FIG. 2P, a passivation layer 44 is formed on the patterned conductive layer 60 and the dielectric layer 11. In some embodiments, the passivation layer 44 includes a suitable insulating material. For example, the passivation layer 44 may include a SiN$_x$ film; however, other suitable materials may be additionally or alternatively used. In one or more embodiments, a thickness of the passivation layer 44 is in a range of about 10 μm to about 20 μm.

Referring to FIG. 2Q, a solder 94 is formed in the passivation layer 44. The solder 94 may be a solder bump. Thus, the portion 1' of the semiconductor package 1 is formed.

Figure 3A:
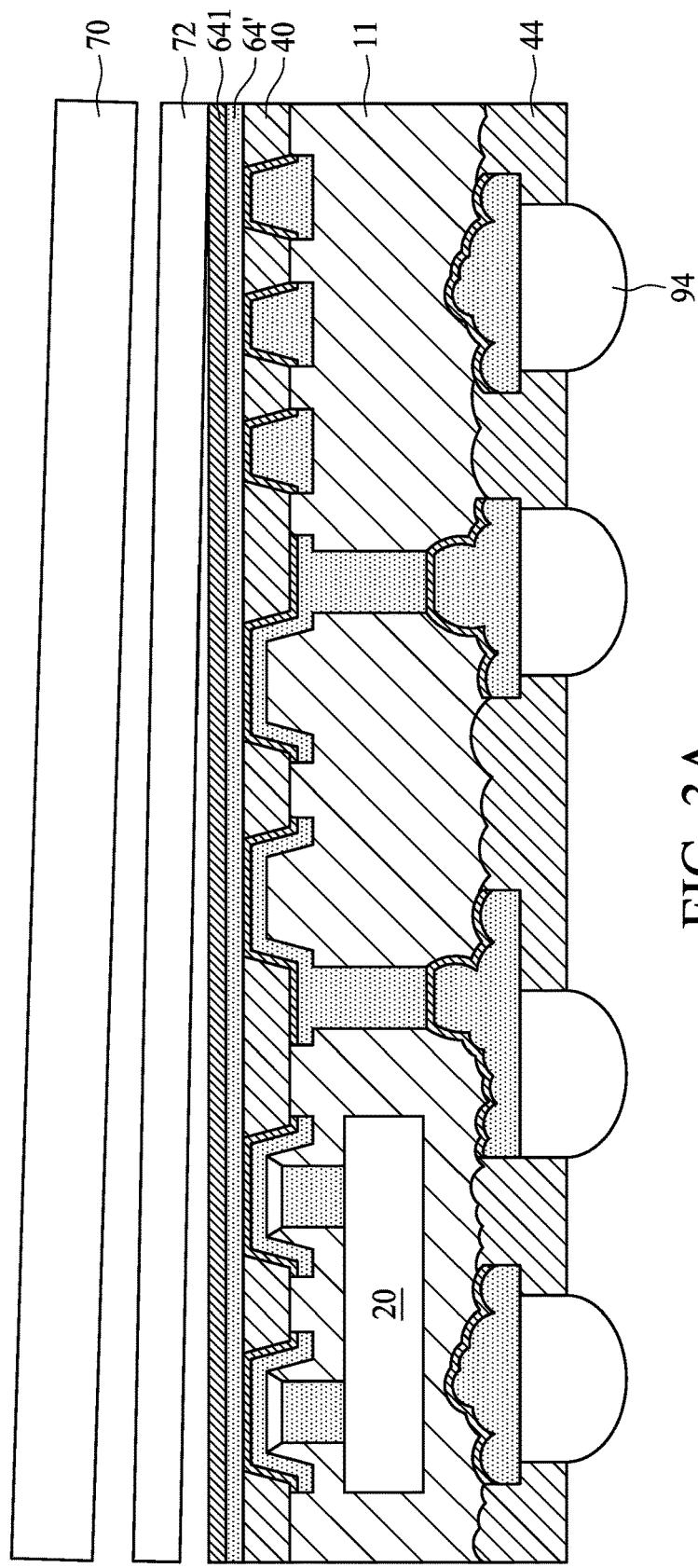
FIG. 3A, FIG. 3B, FIG. 3C, FIG. 3D, FIG. 3E, FIG. 3F, FIG. 3G FIG. 3H, FIG. 3I, FIG. 3J, and FIG. 3K illustrate a method for manufacturing the semiconductor package shown in FIG. 1 in accordance with some embodiments.

FIG. 3A through FIG. 3K illustrate a method for manufacturing the semiconductor package 1 as shown in FIG. 1 in accordance with some embodiments. Referring to FIG. 3A, the carrier 70 and the release layer 72 are removed.

Figure 3B:
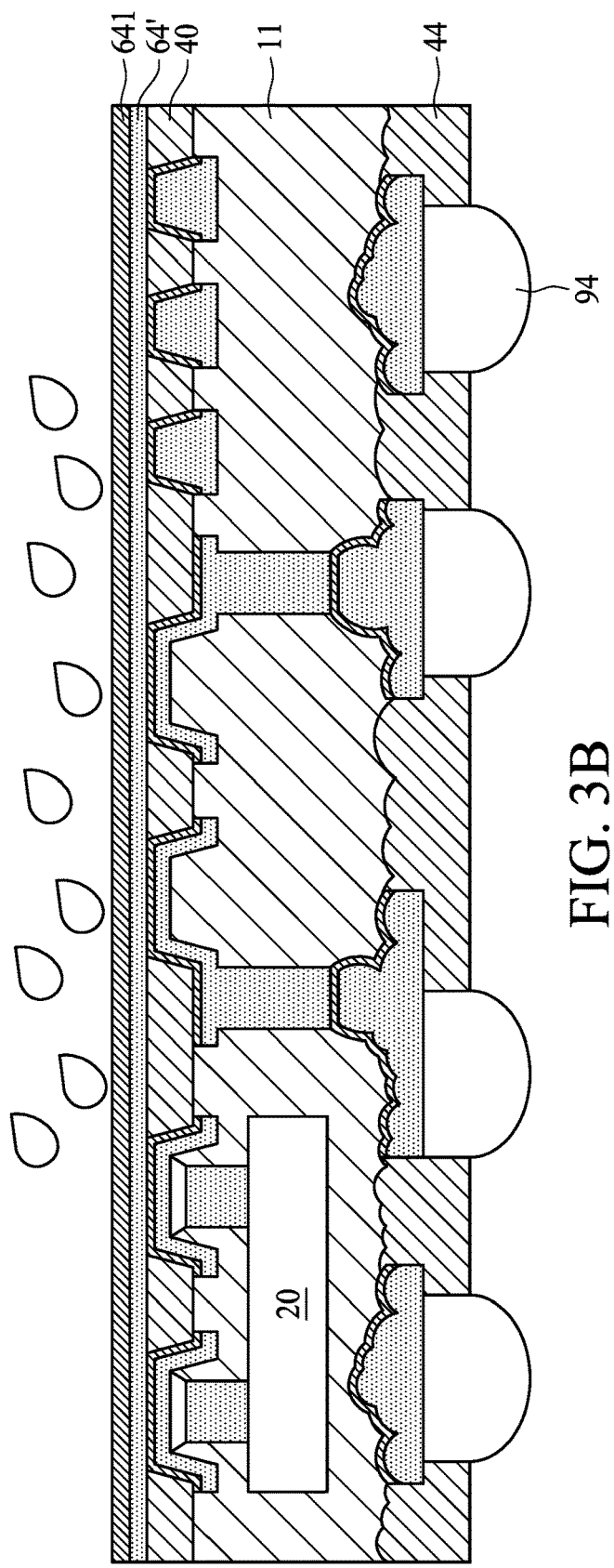

Referring to FIG. 3B, the sublayer 641 is removed using etching.

Figure 3C:
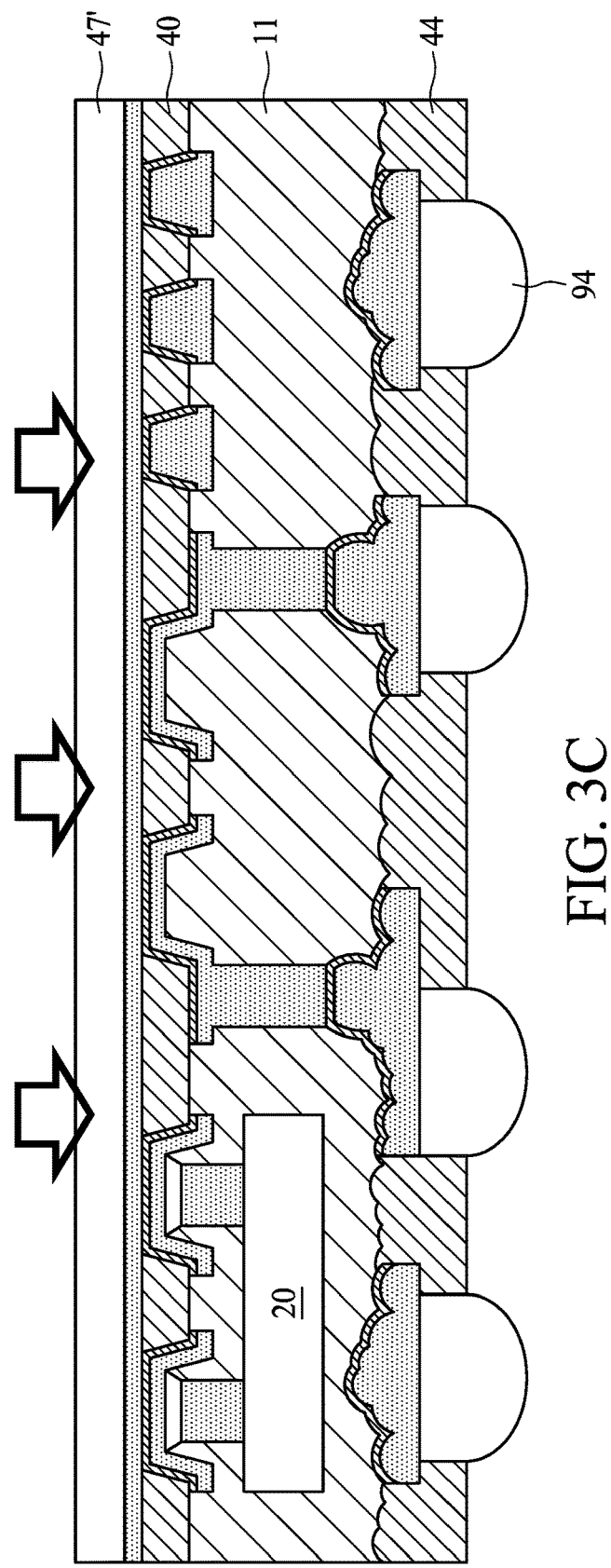

Referring to FIG. 3C, a photoresist layer 47' is formed by coating. In one or more embodiments, a material of the photoresist layer 47' may include, for example, a photosensitive material, a positive polyimide, a positive photoresist or other suitable materials.

Figure 3D:
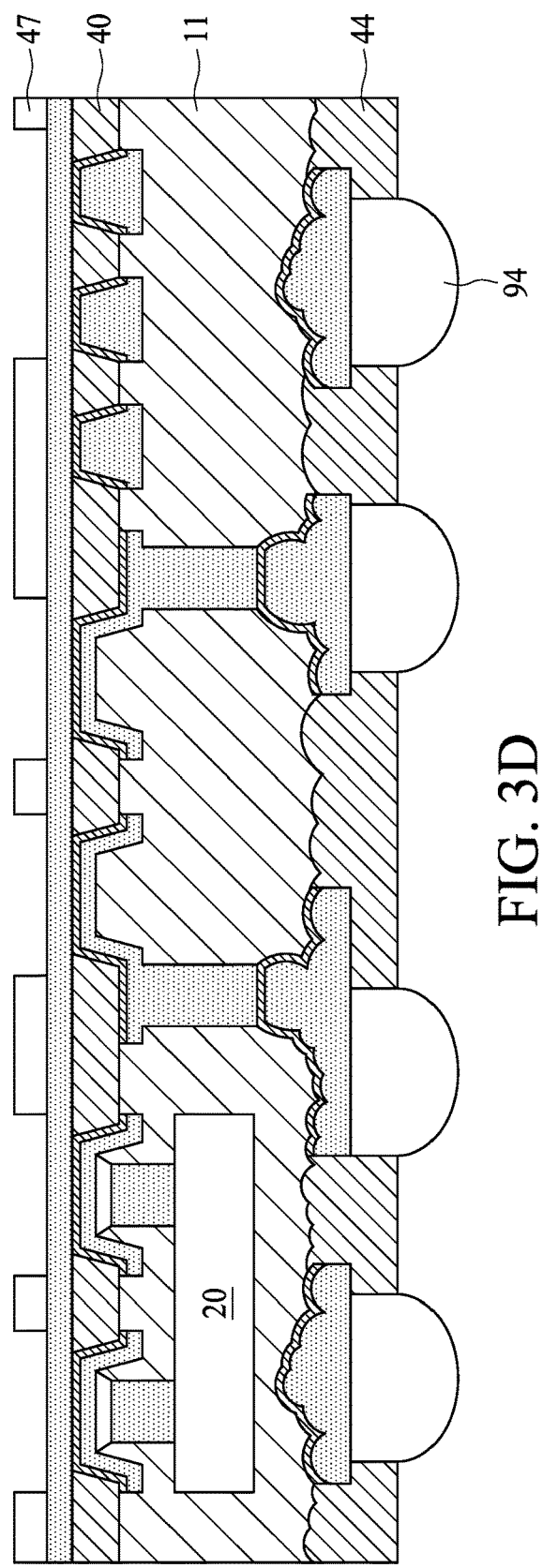

Referring to FIG. 3D, the patterned photoresist layer 47 is formed using a photolithography etching operation to pattern the photoresist layer 47'. A portion of the patterned conductive layer 64' is exposed. The thickness of the exposed portion of the patterned conductive layer 64' is increased by plating.

Figure 3E:
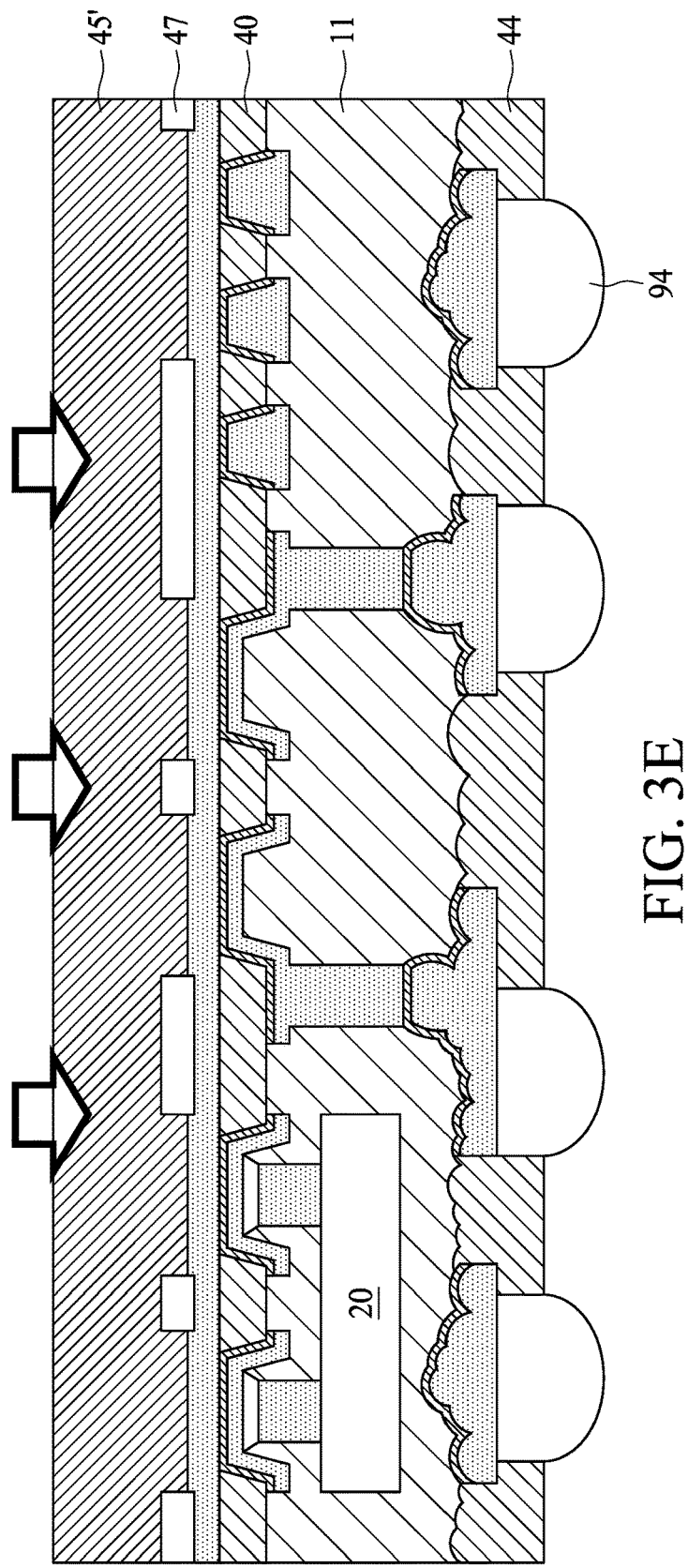

Referring to FIG. 3E, a photoresist layer 45' is formed by coating. In one or more embodiments, a material of the photoresist layer 45' may include, for example, a photosensitive material, a positive polyimide, a positive photoresist or other suitable materials.

Figure 3F:
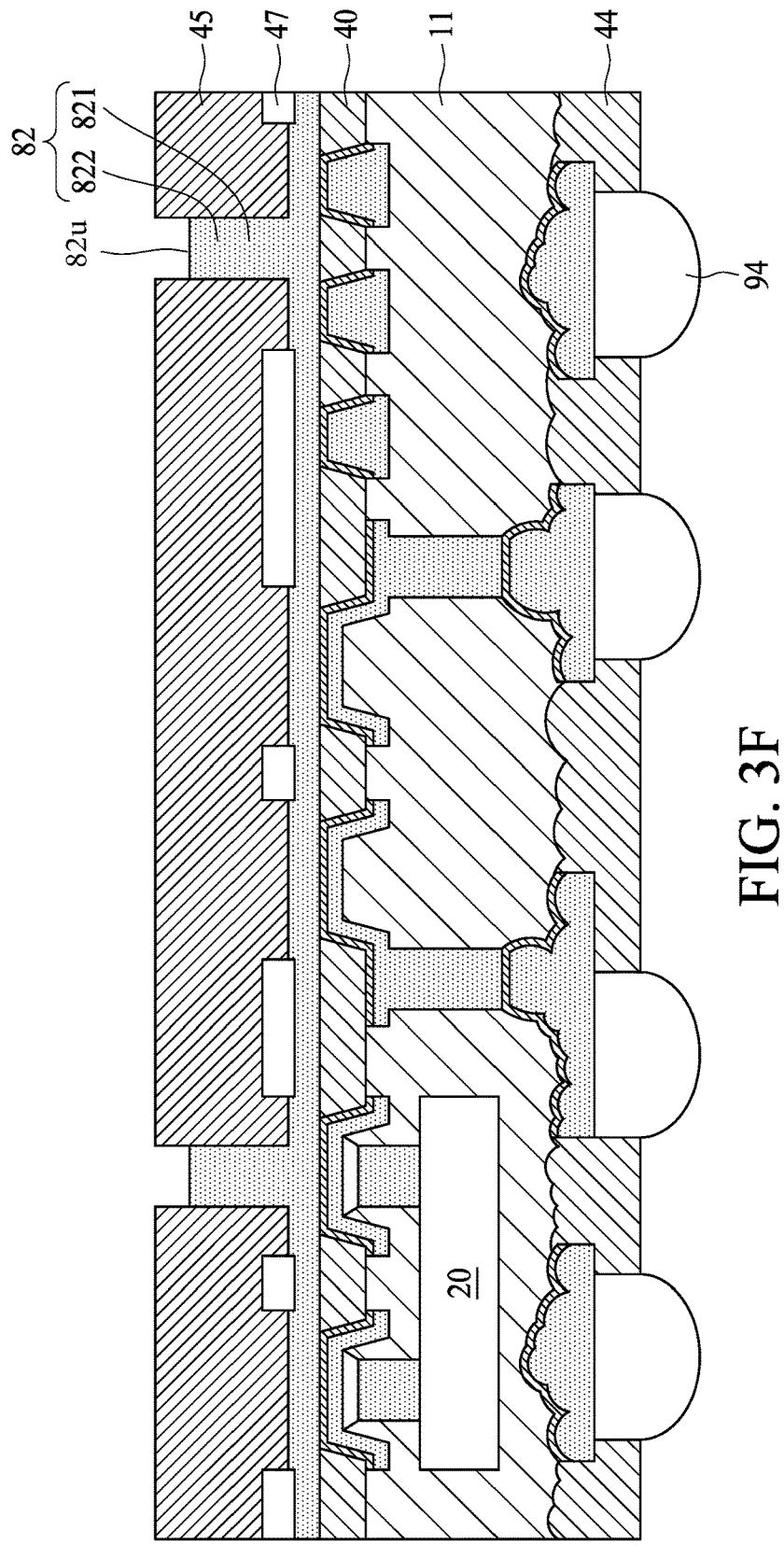

Referring to FIG. 3F, the patterned photoresist layer 45 is formed using a photolithography etching operation to pattern the photoresist layer 45'. The conductive post 82 is formed in the patterned photoresist layer 45. The conductive post 82 has a top surface 82u. The conductive post 82 has a first portion 821 and a second portion 822 disposed above the first portion 821. The second portion 822 of the conductive post 82 is recessed from the top surface of the patterned photoresist layer 45. In some embodiments, the conductive post 82 is a monolithic structure, and the first portion 821 and the second portion 822 are integrally formed with one another without a detectable interface in between.

Figure 3G:
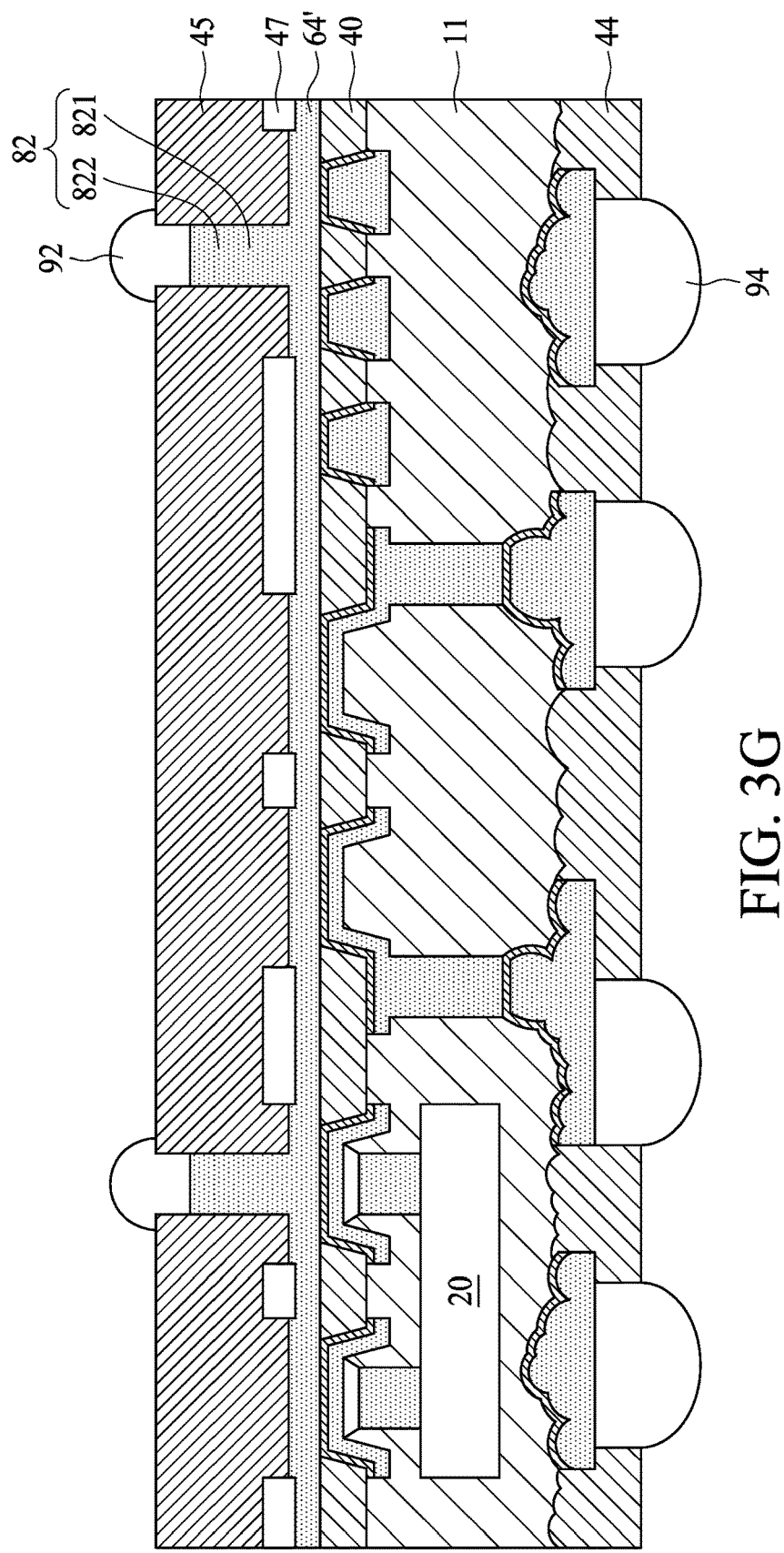

Referring to FIG. 3G a sacrificial element 92 is formed on the top surface 82u of the conductive post 82. The sacrificial element 92 may include Sn.

Figure 3H:
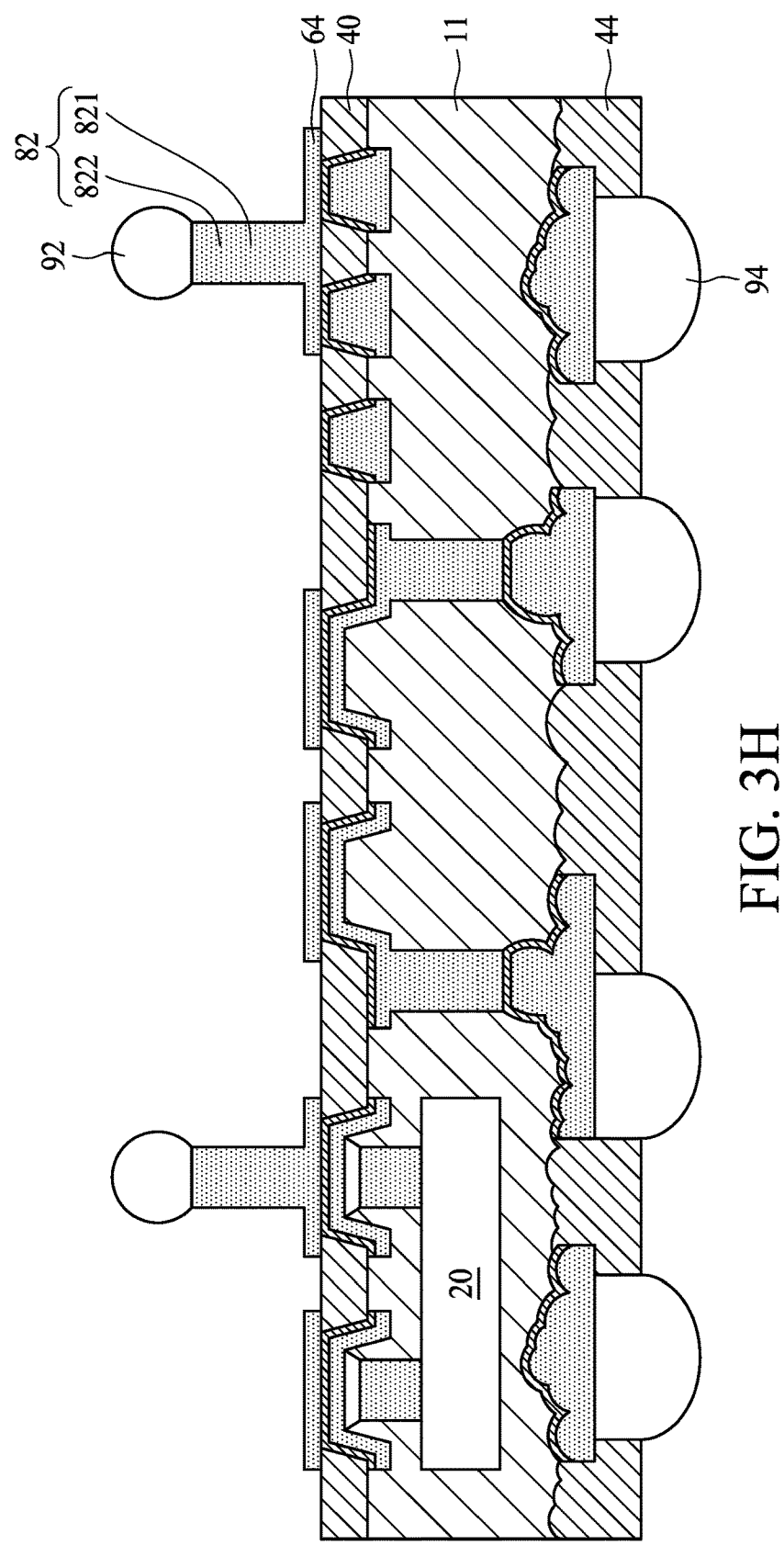

Referring to FIG. 3H, the patterned photoresist layers 45 and 47 are removed by etching. A portion of the patterned conductive layer 64' is removed by etching, forming the patterned conductive layer 64. A heating operation is performed to reflow the sacrificial element 92. The sacrificial element 92 contains Sn in an amount greater than about 90 wt %, such as about 92 wt % or more, or about 94 wt % or more. The melting point of the sacrificial element 92 is lower than the melting point of the conductive post 82 (e.g. by about 10° C. or more, about 30° C. or more, or about 50° C. or more).

Figure 3I:
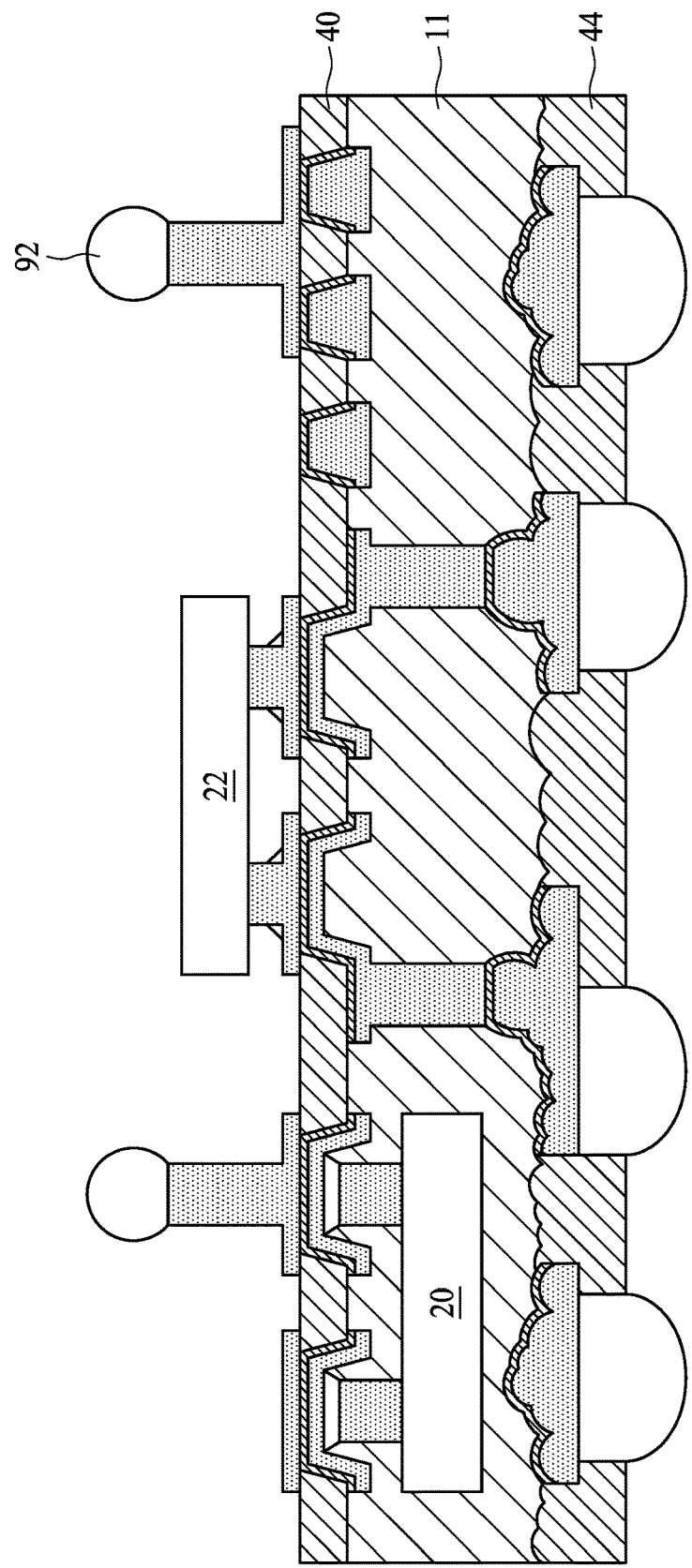

Referring to FIG. 3I, an electrical component 22 is bonded to the patterned conductive layer 64.

Figure 3J:
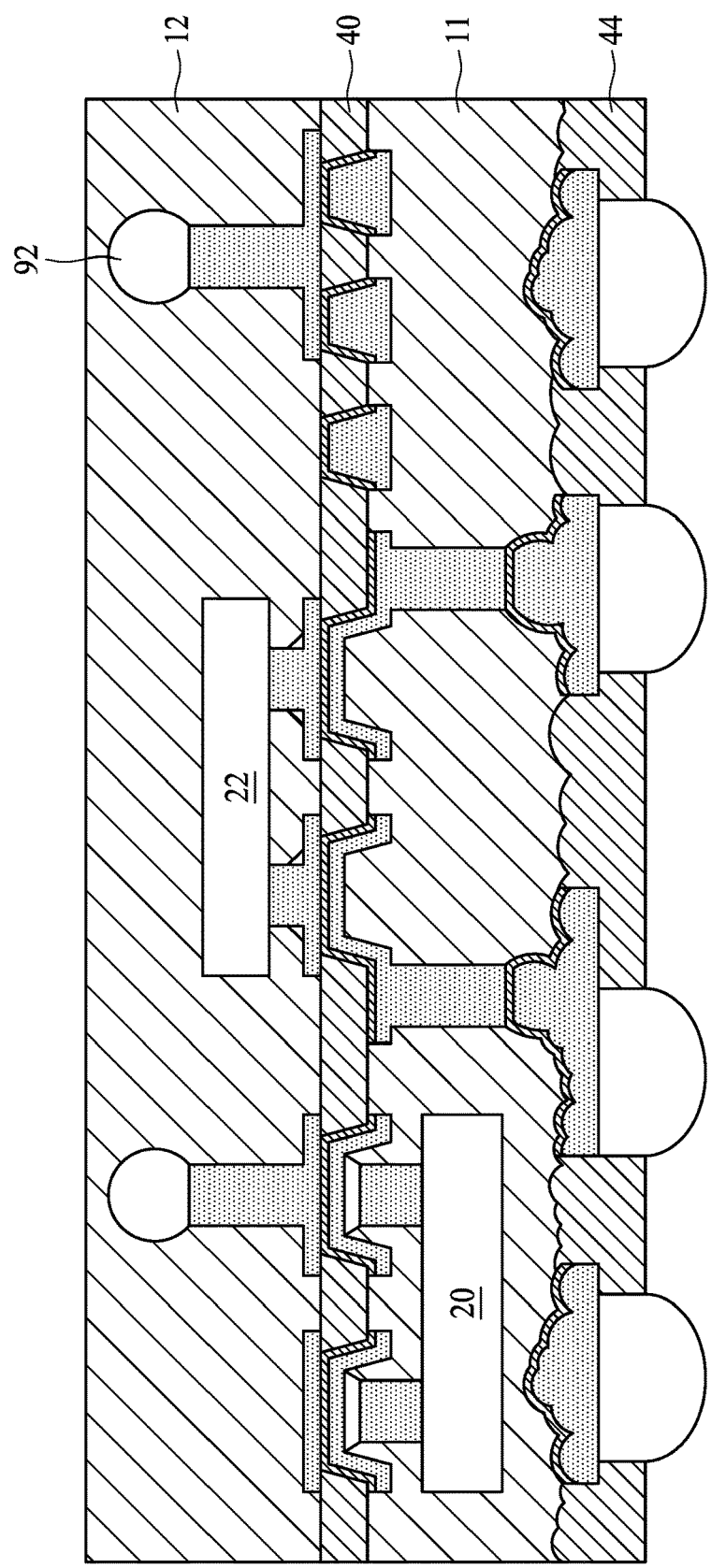

Referring to FIG. 3J, a dielectric layer 12 is formed to encapsulate the electrical component 22, conductive post 82 and sacrificial element 92. The dielectric layer 12 may include a molding material, an encapsulant or a molding compound. The molding material/encapsulant/molding compound may include a resin and/or fillers/particles.

Figure 3K:
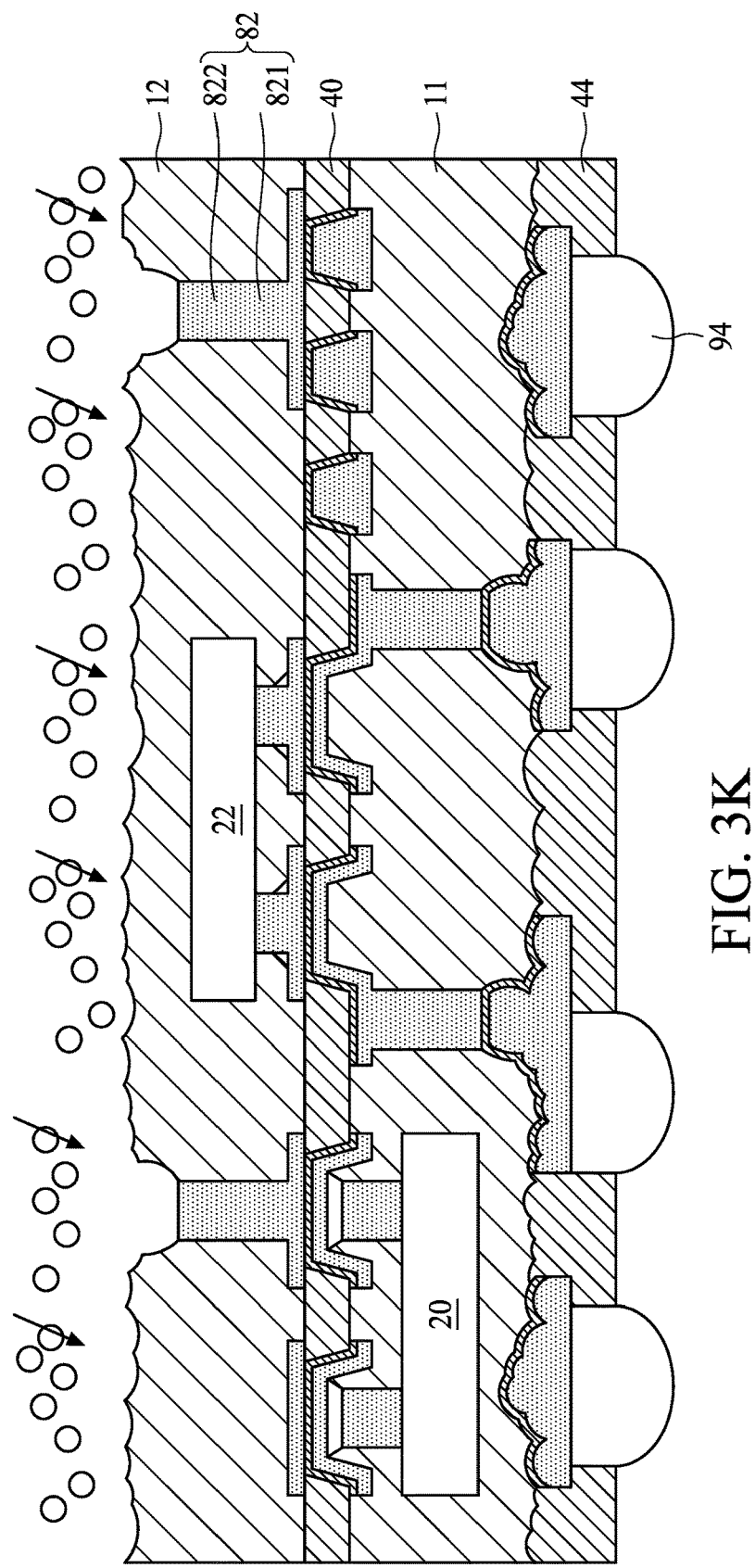

Referring to FIG. 3K, a portion of the dielectric layer 12 is removed using a compressed nitrogen gas at a temperature equal to or lower than about 13° C. (e.g. equal to or lower than about 8° C., equal to or lower than about 3° C., or equal to or lower than about −2° C.) to sandblast a powder including particles that have respective widths between about 2 μm and about 10 The powder includes one or more of a ceramic (e.g. a silicon carbide, an oxide such as aluminum oxide as contained in emery, or a glass), steel, iron, or a resin (e.g. a plastic). The sandblasting may form a rough surface 121u having a surface profile with peaks and with indentations having sizes comparable to sizes of particles used for sandblasting. A surface roughness of the surface 121u may be similar to, or different from, that explained for the surface 111b. A portion of the dielectric layer 12 is removed by sandblasting the powder on to the dielectric layer 12 using high pressure nitrogen gas at a temperature equal to or lower than about −20° C. (e.g. equal to or lower than about −25° C., equal to or lower than about −30° C., or equal to or lower than about −35° C.). The pressure of the nitrogen gas is in a range between about 2 kg/cm² to about 10 kg/cm². Next, the patterned conductive layer 68 including a sublayer 681 and a sublayer 682 is formed. After the forming of the patterned conductive layer 68, the semiconductor package 1 as shown in FIG. 1 is formed.

Figure 4:
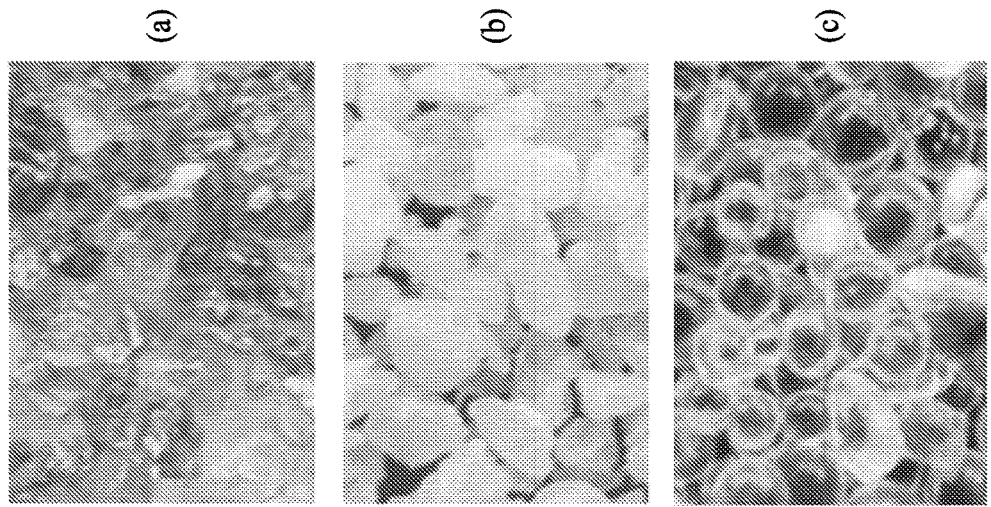
FIG. 4 illustrates schematic diagrams of a sandblasting device in accordance with some embodiments of the present disclosure.
Figure 4:
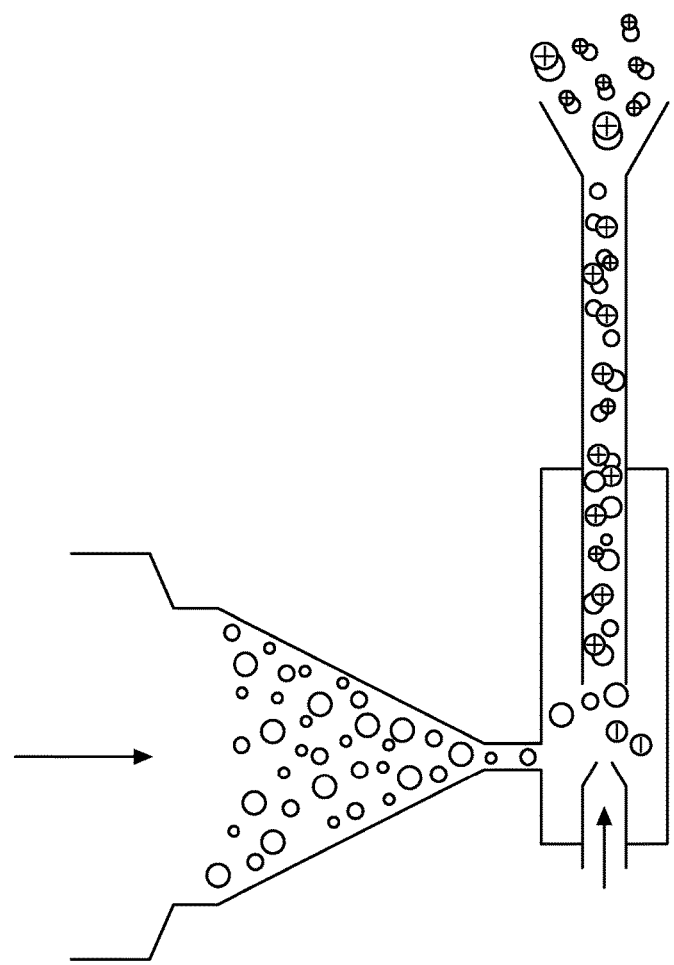

FIG. 4 illustrates schematic diagrams of a sandblasting device in accordance with some embodiments. Powder is input to an upper opening. A compressed nitrogen gas is input from a lateral opening. The sandblasting device uses a compressed nitrogen gas at a temperature equal to or lower than about 13° C. (e.g. equal to or lower than about 8° C., equal to or lower than about 3° C., or equal to or lower than about −2° C.) to sandblast the powder having particles having respective widths between about 2 μm and about 10 In some embodiments, the temperature of the nitrogen gas is controlled to be equal to or lower than about −20° C. (e.g. equal to or lower than about −25° C., equal to or lower than about −30° C., or equal to or lower than about −35° C.). The powder includes one or more of a ceramic (e.g. a silicon carbide, an oxide such as aluminum oxide as contained in emery, or a glass), steel, iron, or a resin (e.g. a plastic). The powders as shown in image (a) of FIG. 4 may be ceramic powders and respective widths of the particles thereof are between about 5 μm and about 10 The powders as shown in image (b) of FIG. 4 may be resin powders and respective widths of the particles thereof are between about 2 μm and about 4 The powders as shown in image (c) of FIG. 4 may be glass powders and respective widths of the particle thereof are between about 3 μm and about 6 μm.

Figure 5:
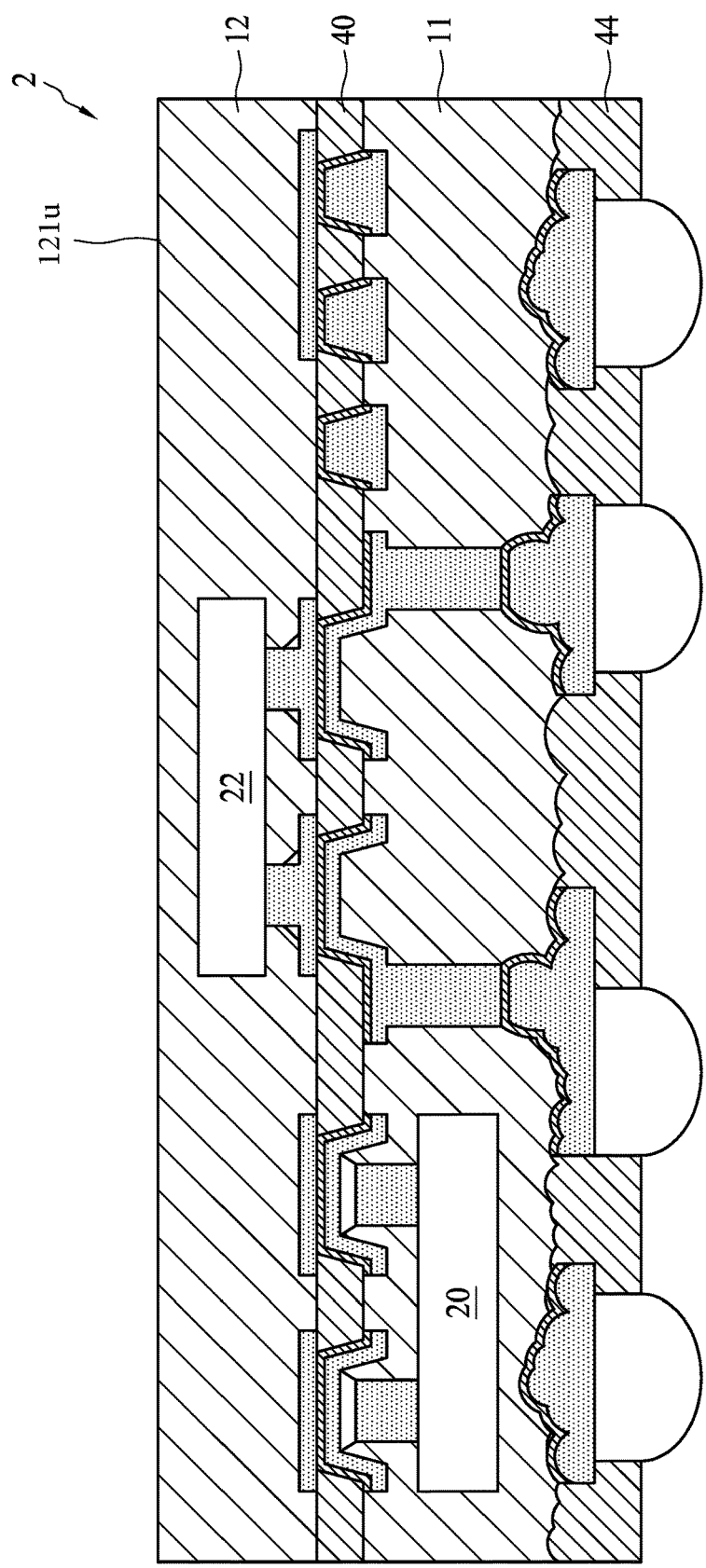
FIG. 5 is a cross-sectional view of a semiconductor package in accordance with some embodiments of the present disclosure.

FIG. 5 is a cross-sectional view of a semiconductor package 2 in accordance with some embodiments of the present disclosure. The semiconductor package 2 includes dielectric layers 11 and 12, electrical components 20 and 22, insulation layers 40 and 44, patterned conductive layers 60, 62, and 64, one or more conductive posts 80 and solder 94. The semiconductor package 2 is similar to the semiconductor package 1 of FIG. 1 in certain respects, and certain details of same-numbered components are not described again with respect to FIG. 5. The surface 121u of the dielectric layer 12 is not roughened by sandblasting. A surface 121u of the dielectric layer 12 is smoother than the surface 111b of the dielectric layer 11.

Figure 6:
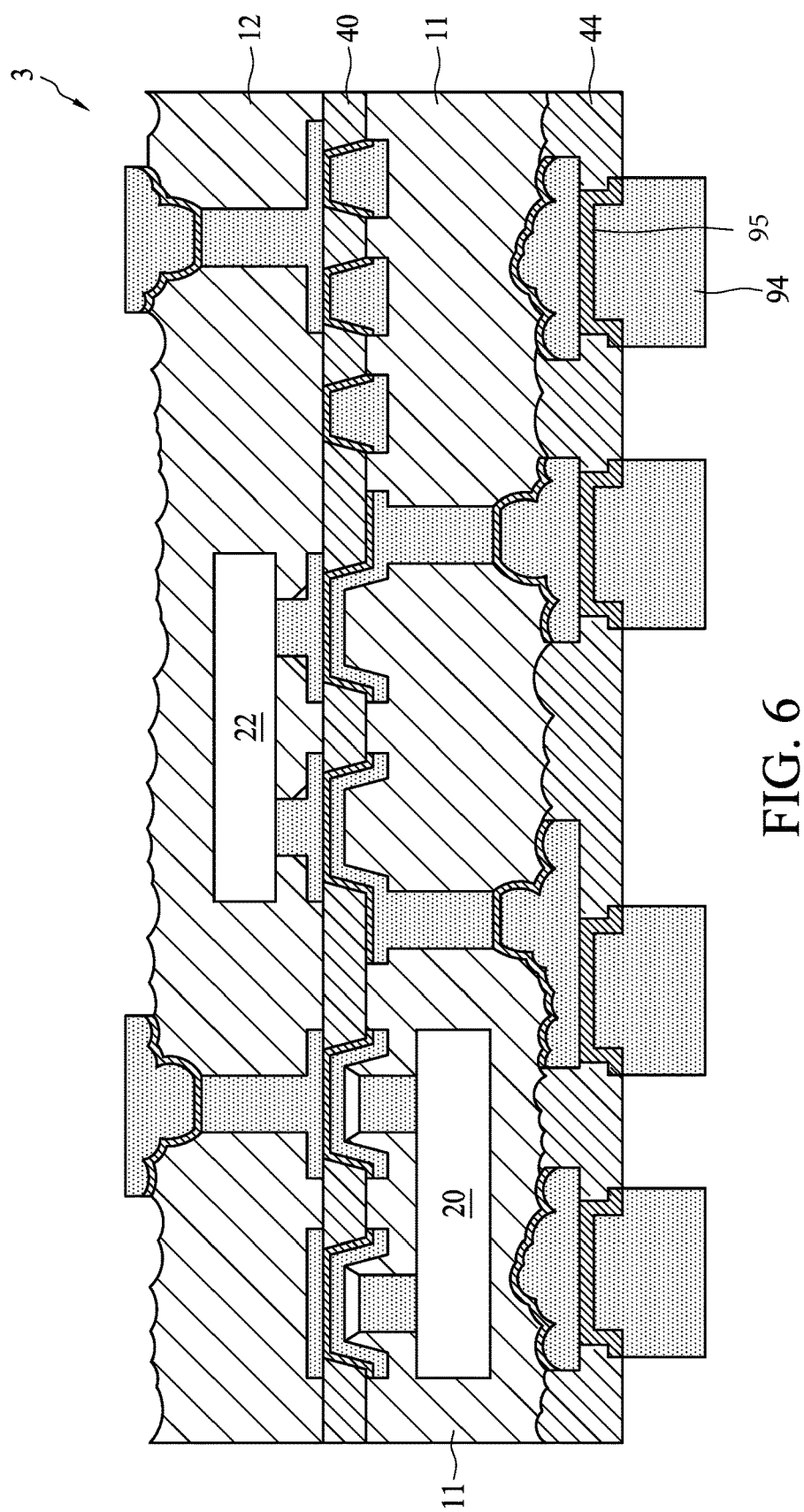
FIG. 6 is a cross-sectional view of a semiconductor package in accordance with some embodiments of the present disclosure.

FIG. 6 is a cross-sectional view of a semiconductor package 3 in accordance with some embodiments of the present disclosure. The semiconductor package 3 includes dielectric layers 11 and 12, electrical components 20 and 22, insulation layers 40 and 44, patterned conductive layers 60, 62, 64 and 68, conductive posts 80 and 82, under bump metallization 95, and solder 94. The semiconductor package 3 is similar to the semiconductor package 1 of FIG. 1 in certain respects, and certain details of same-numbered components are not described again with respect to FIG. 6. In some embodiments, the insulation layers 40 and 44 include organic materials (e.g., a PI, an ABF, a PP or an epoxy based material). In some embodiments, the dielectric layers 11 and 12 include organic materials (e.g., a molding compound) and/or other suitable materials. In some embodiments, the insulation layers 40 and 44 include inorganic materials (e.g., $SiO_x$, $SiN_x$, $TaO_x$, a glass, silicon, or a ceramic). The solder 94 is connected to internal components of the package 3 through the under bump metallization 95.

Figure 7A:
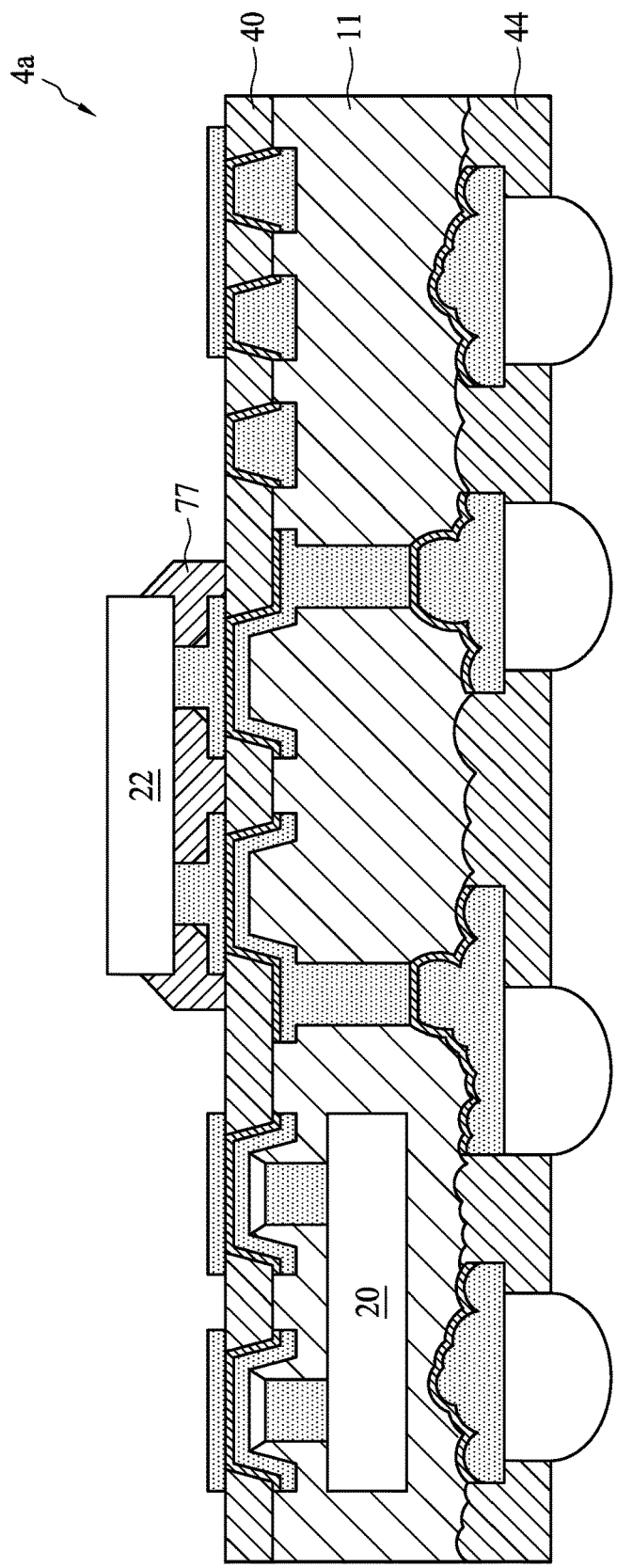
FIG. 7A, FIG. 7B, FIG. 7C, and FIG. 7D are cross-sectional views of semiconductor packages in accordance with some embodiments of the present disclosure.
Figure 7B:
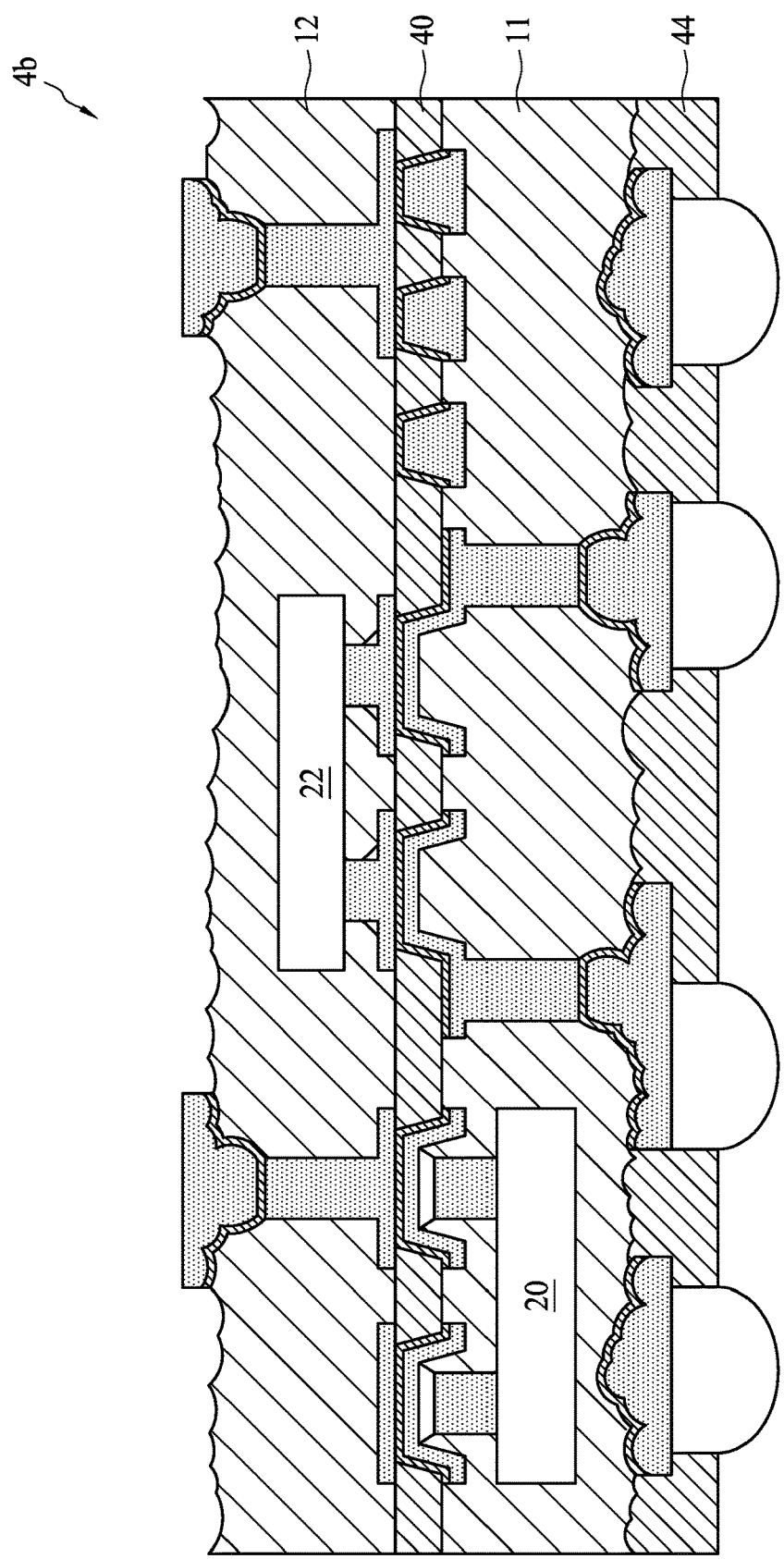
Figure 7C:
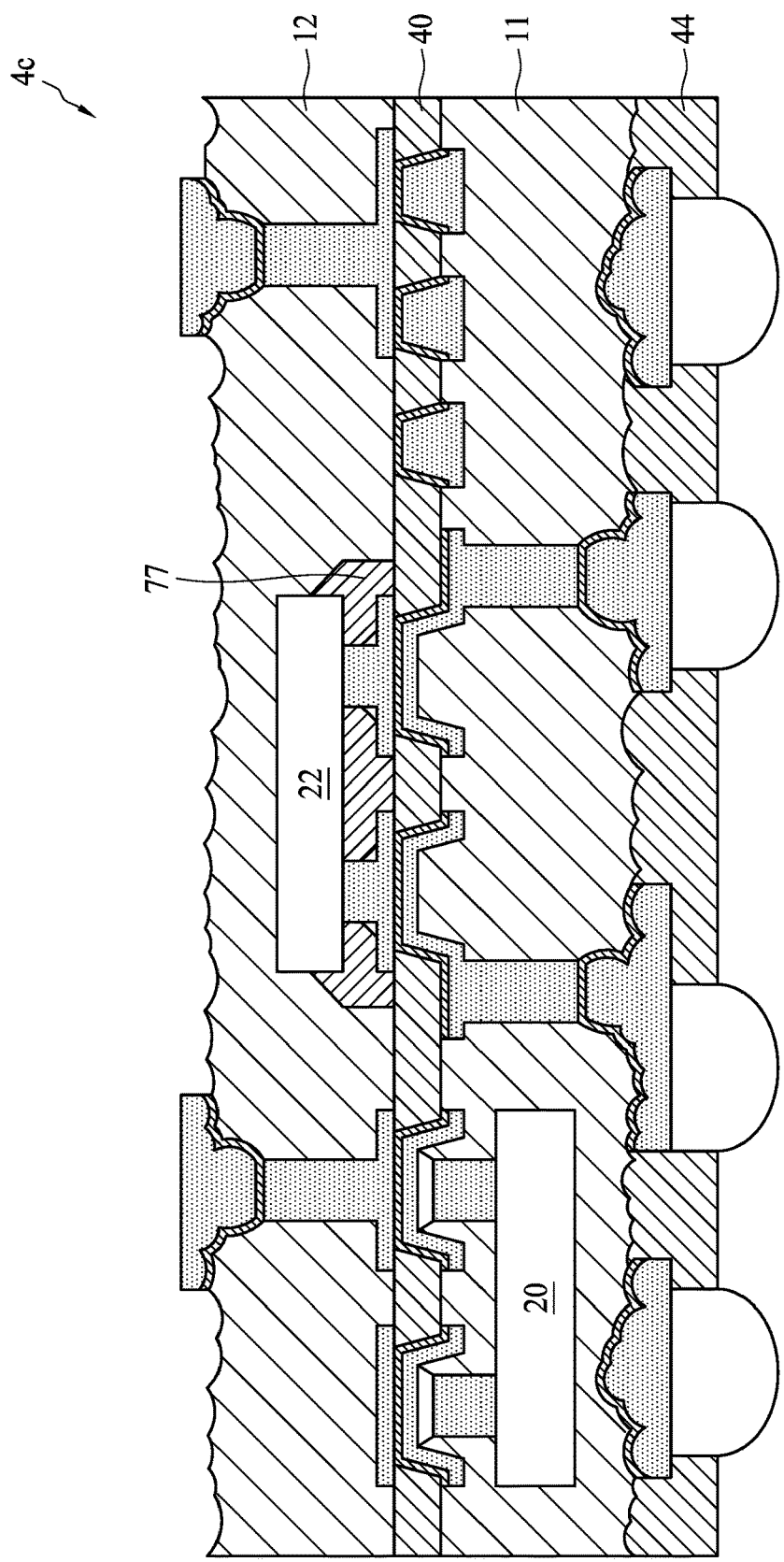
Figure 7D:
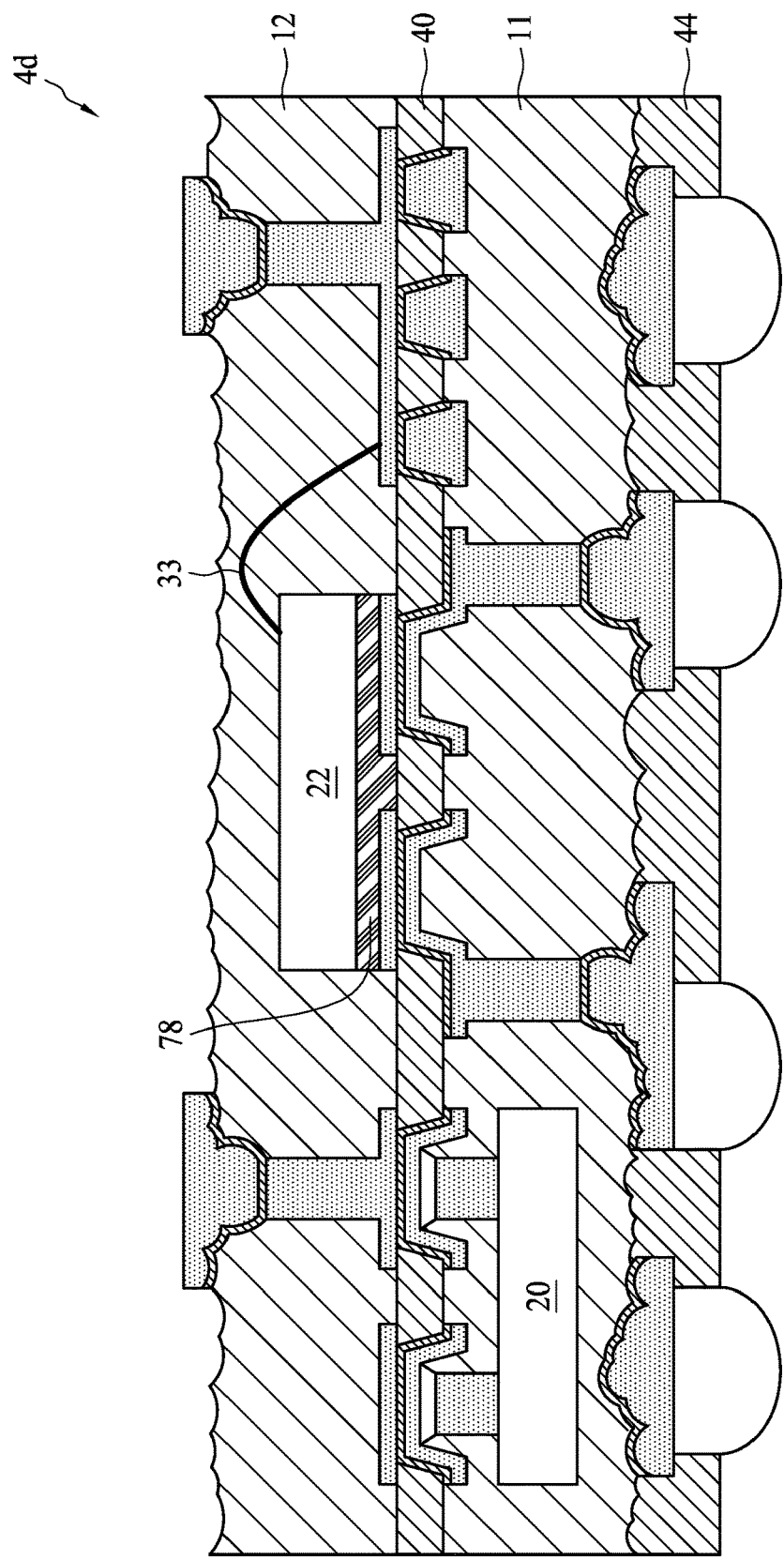

FIG. 7A through 7D are cross-sectional views of semiconductor packages 4a through 4d in accordance with some embodiments of the present disclosure. The semiconductor packages 4a through 4d are similar to the semiconductor package 1 of FIG. 1 in certain respects, and certain details of same-numbered components are not described again with respect to FIG. 7A through 7D. Referring to FIG. 7A, the electrical component 22 is attached to the insulation layer 40 using a capillary underfill (CUF) operation. The electrical component 22 is attached to the insulation layer 40 using an adhesive layer 77. Referring to FIG. 7B, the electrical component 22 is attached to the insulation layer 40 using a molded underfill (MUF) operation. The electrical component 22 is encapsulated by the dielectric layer 12, and an adhesive layer may be omitted. Referring to FIG. 7C, the electrical component 22 is attached to the insulation layer 40 using a CUF operation. The electrical component 22 and the adhesive layer 77 are encapsulated by the dielectric layer 12. Referring to FIG. 7D, the electrical component 22 is attached to the insulation layer 40 using an adhesive layer 78. The top surface of the electrical component 22 is electrically connected to the patterned conductive layer 64 in a wire bonding process using a wire 33.

Figure 8A:
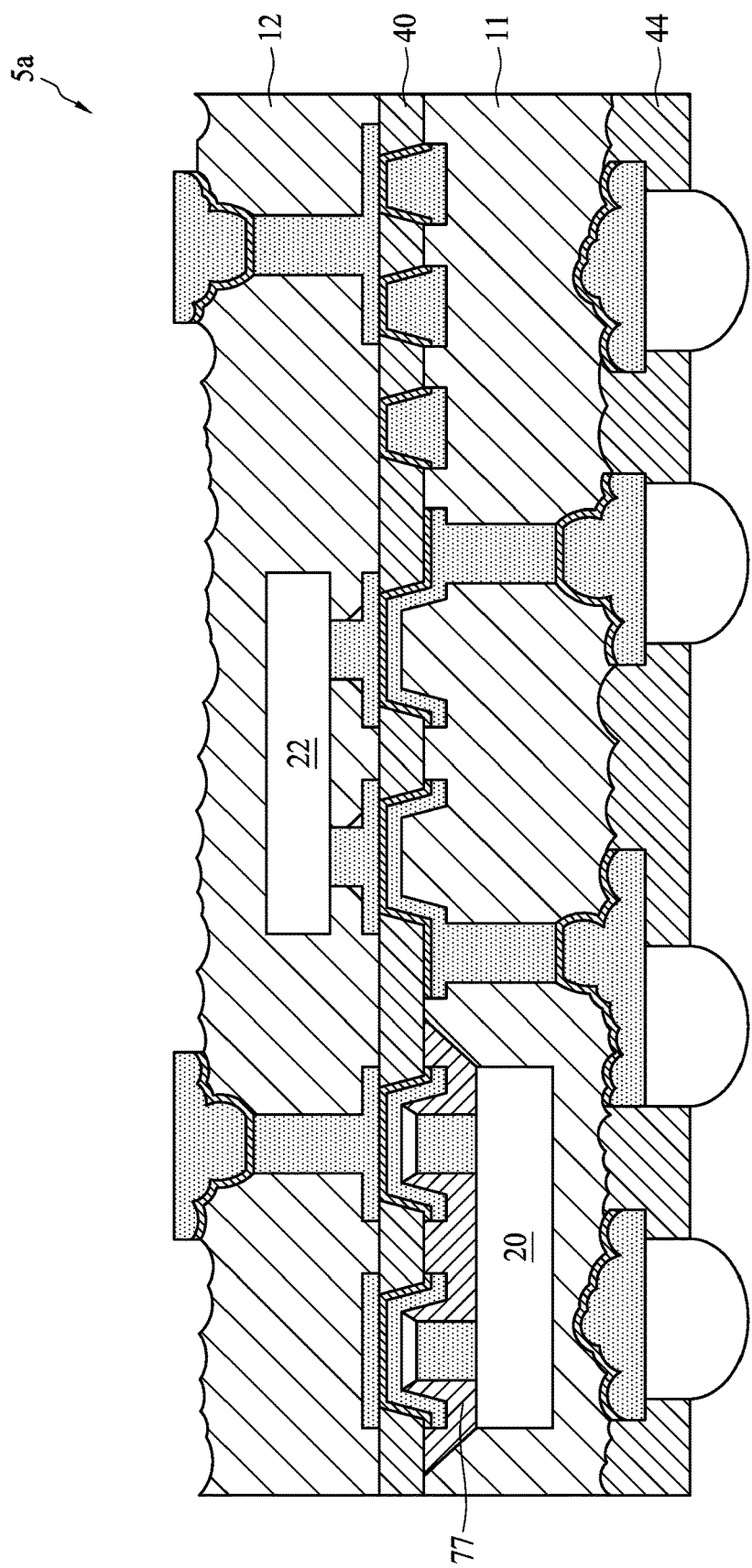
FIG. 8A, FIG. 8B, and FIG. 8C are cross-sectional views of semiconductor packages in accordance with some embodiments of the present disclosure.
Figure 8B:
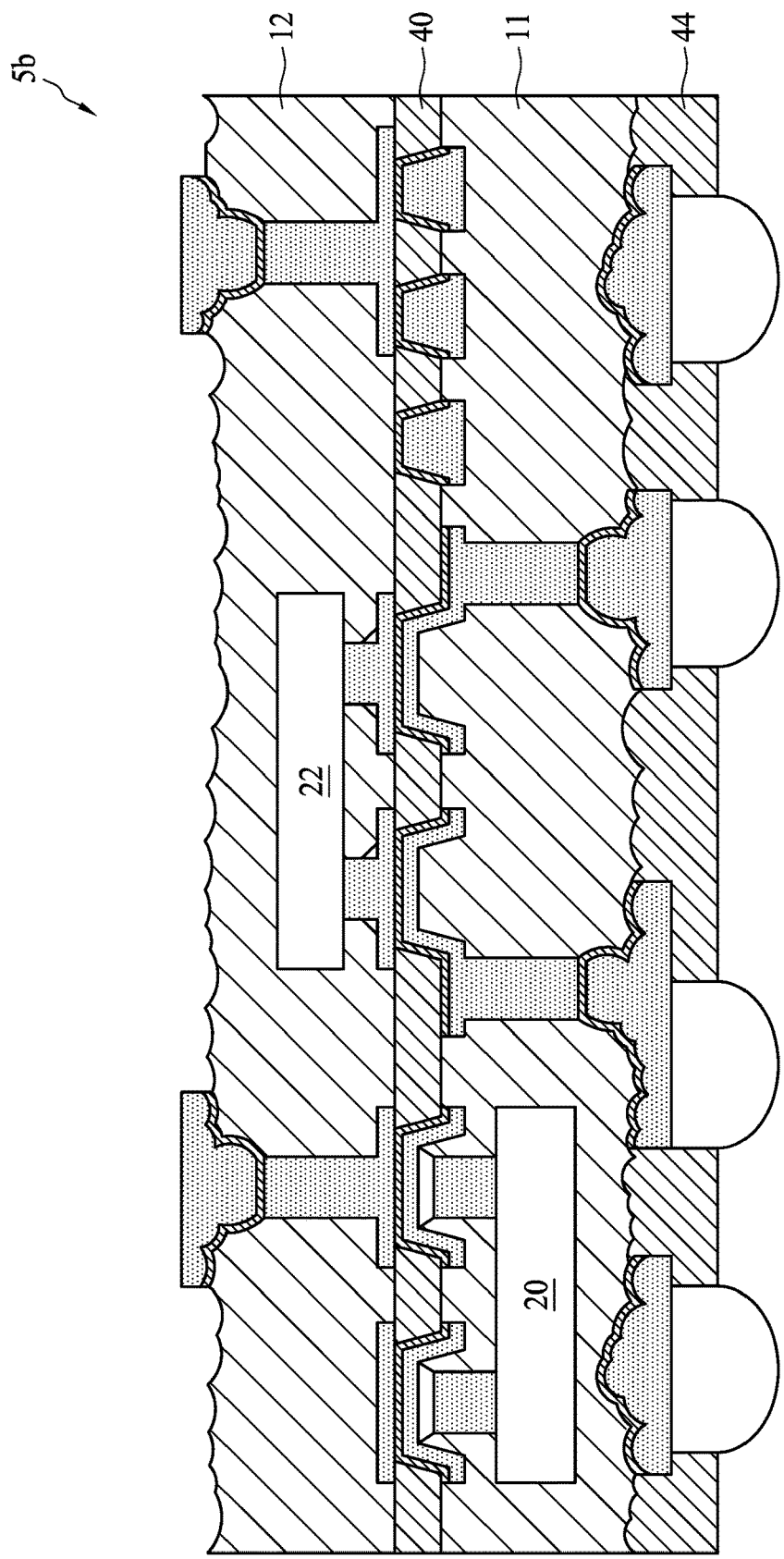
Figure 8C:
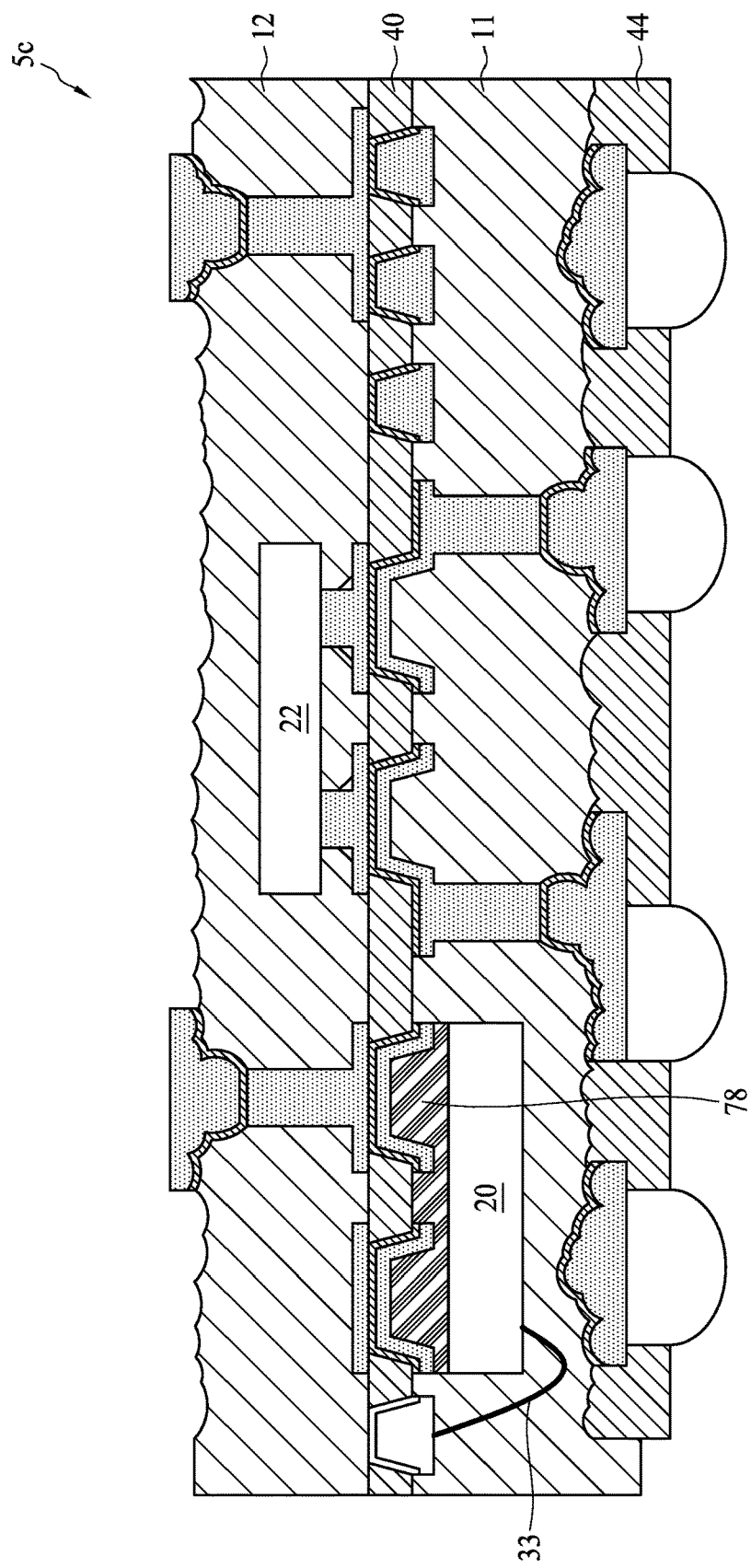

FIG. 8A through 8C are cross-sectional views of semiconductor packages 5a through 5c in accordance with some embodiments of the present disclosure. The semiconductor packages 5a through 5c are similar to the semiconductor package 1 of FIG. 1 in certain respects, and certain details of same-numbered components are not described again with respect to FIG. 8A through 8C. Referring to FIG. 8A, the electrical component 20 is attached to the insulation layer 40 using a CUF operation. The electrical component 20 is attached to the insulation layer 40 using an adhesive layer 77. The electrical component 20 and the adhesive layer 77 are encapsulated by the dielectric layer 11. Referring to FIG. 8B, the electrical component 20 is attached to the insulation layer 40 using a MUF operation. The electrical component 20 is encapsulated by the dielectric layer 11, and an adhesive layer may be omitted. Referring to FIG. 8C, the electrical component 20 is attached to the insulation layer 40 using an adhesive layer 78. The top surface of the electrical component 20 is electrically connected to the patterned conductive layer 62 in a wire bonding process using a wire 33.

Figure 9A:
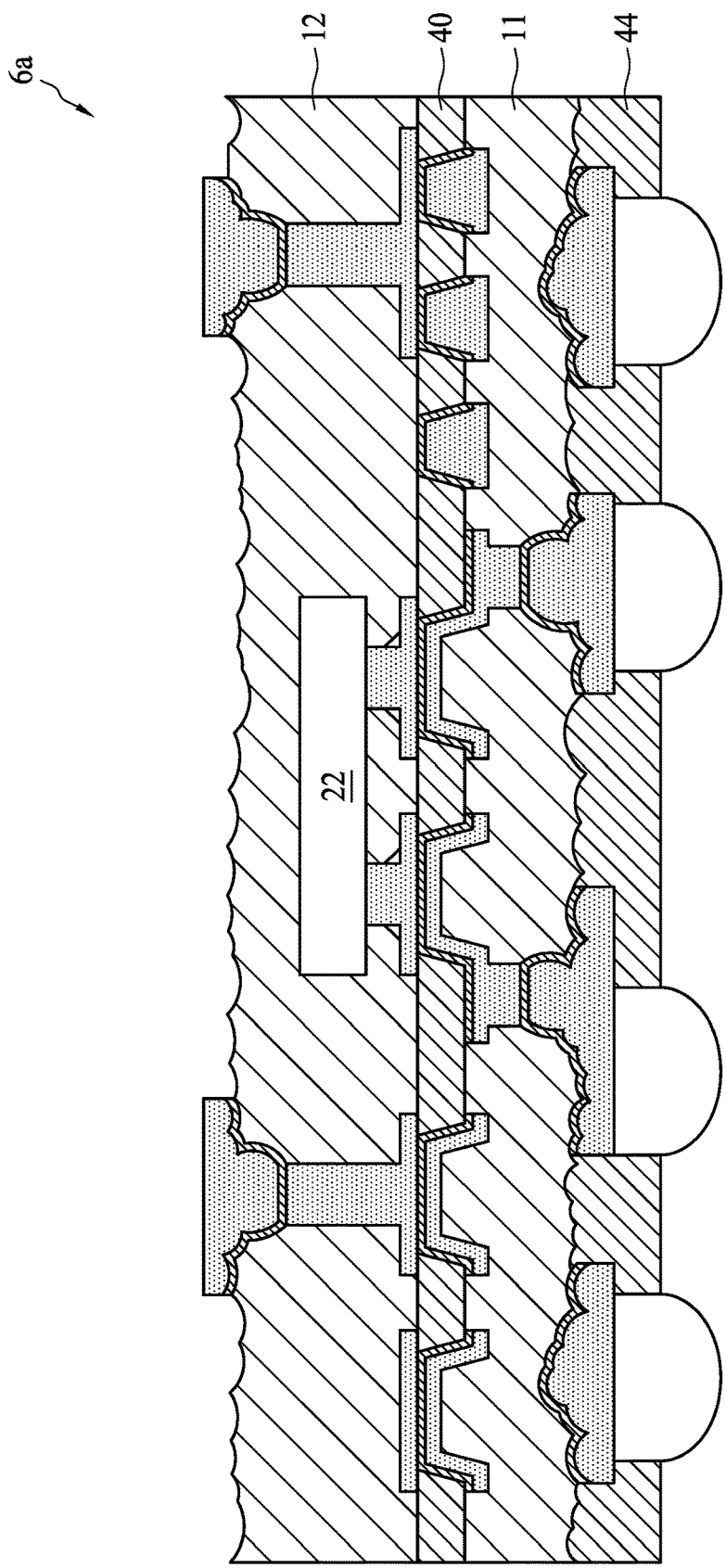
FIG. 9A, FIG. 9B, and FIG. 9C are cross-sectional views of semiconductor packages in accordance with some embodiments of the present disclosure.
Figure 9B:
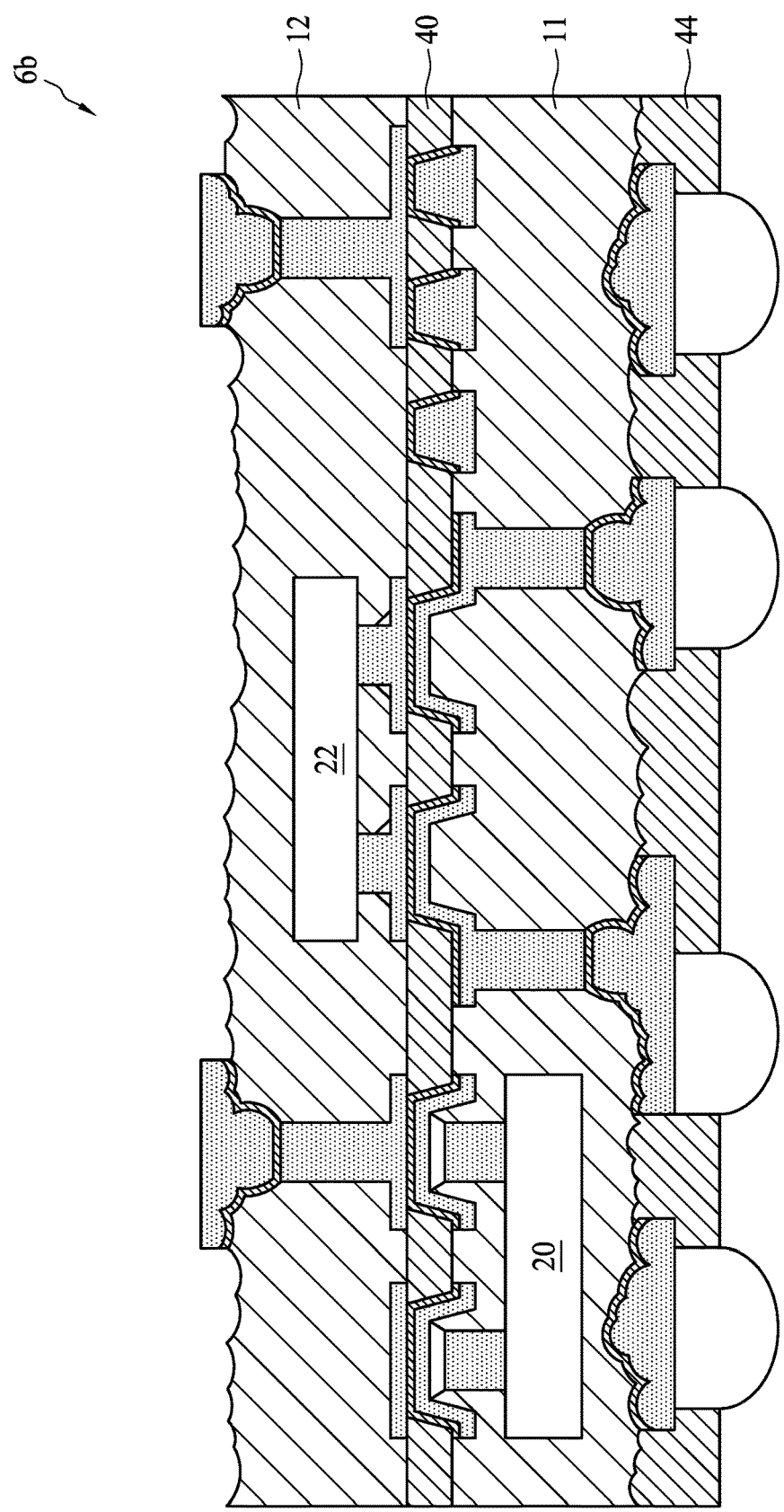
Figure 9C:
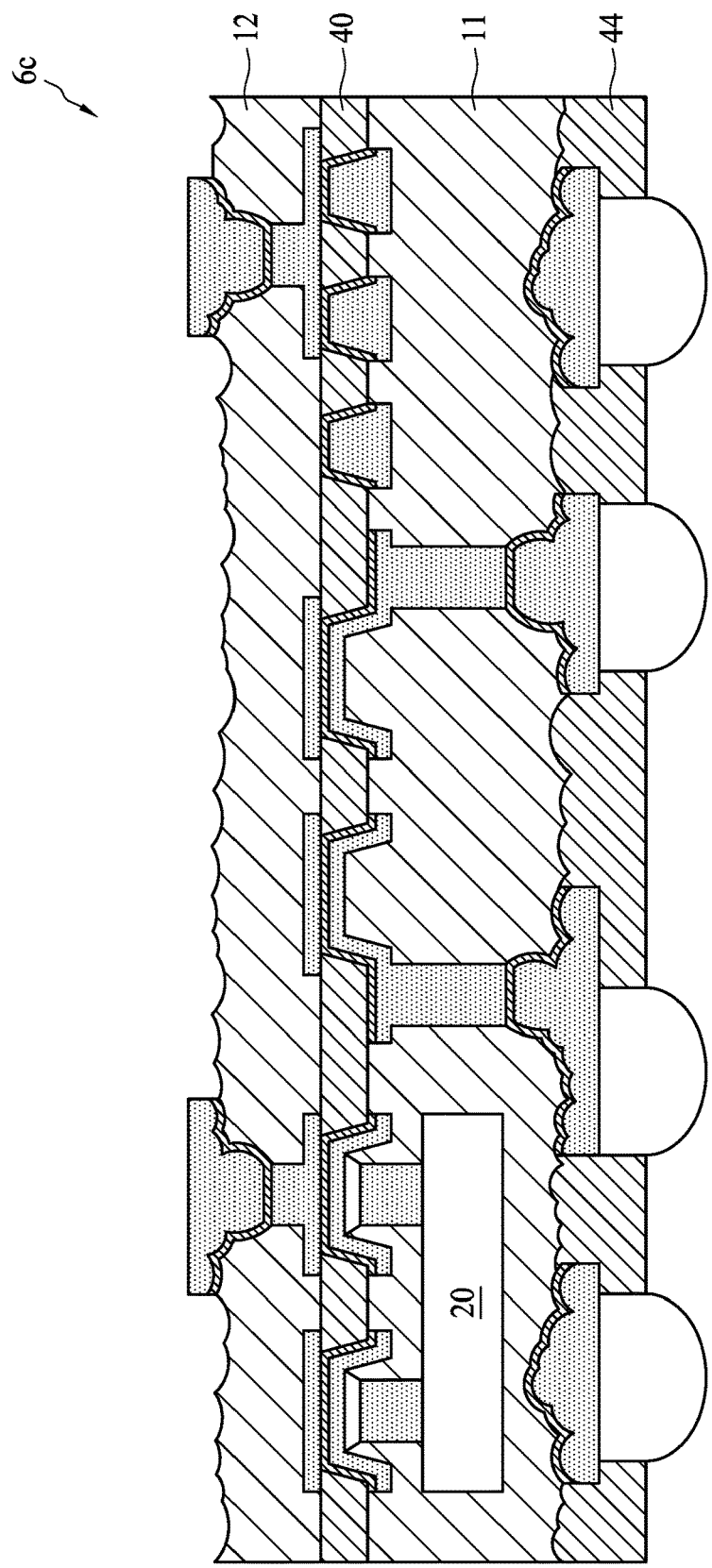

FIG. 9A through 9C are cross-sectional views of semiconductor packages 6a through 6c in accordance with some embodiments of the present disclosure. The semiconductor packages 6a through 6c are similar to the semiconductor package 1 of FIG. 1 in certain respects, and certain details of same-numbered components are not described again with respect to FIG. 9A through 9C. Referring to FIG. 9A, a thickness of the dielectric layer 12 is greater than a thickness of the dielectric layer 11 (e.g. by a factor of about 1.5 or more, about 2.5 or more, or about 3.5 or more). Referring to FIG. 9B, a thickness of the dielectric layer 12 is substantially the same as a thickness of the dielectric layer 11. Referring to FIG. 9C, a thickness of the dielectric layer 12 is less than a thickness of the dielectric layer 11 (e.g. by a factor of about 0.8 or less, about 0.5 or less, or about 0.3 or less).

Figure 10A:
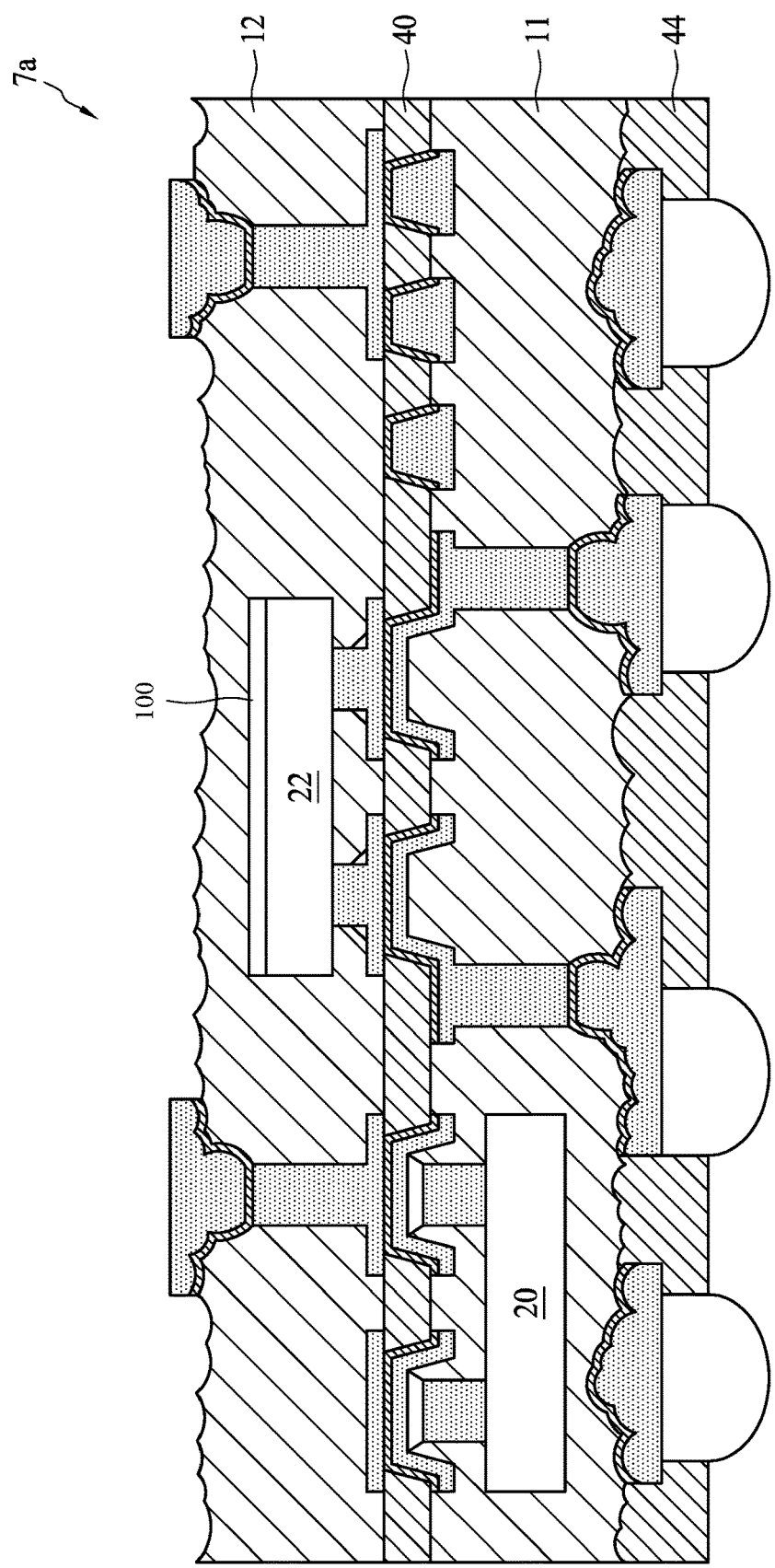
FIG. 10A and FIG. 10B are cross-sectional views of semiconductor packages in accordance with some embodiments of the present disclosure.
Figure 10B:
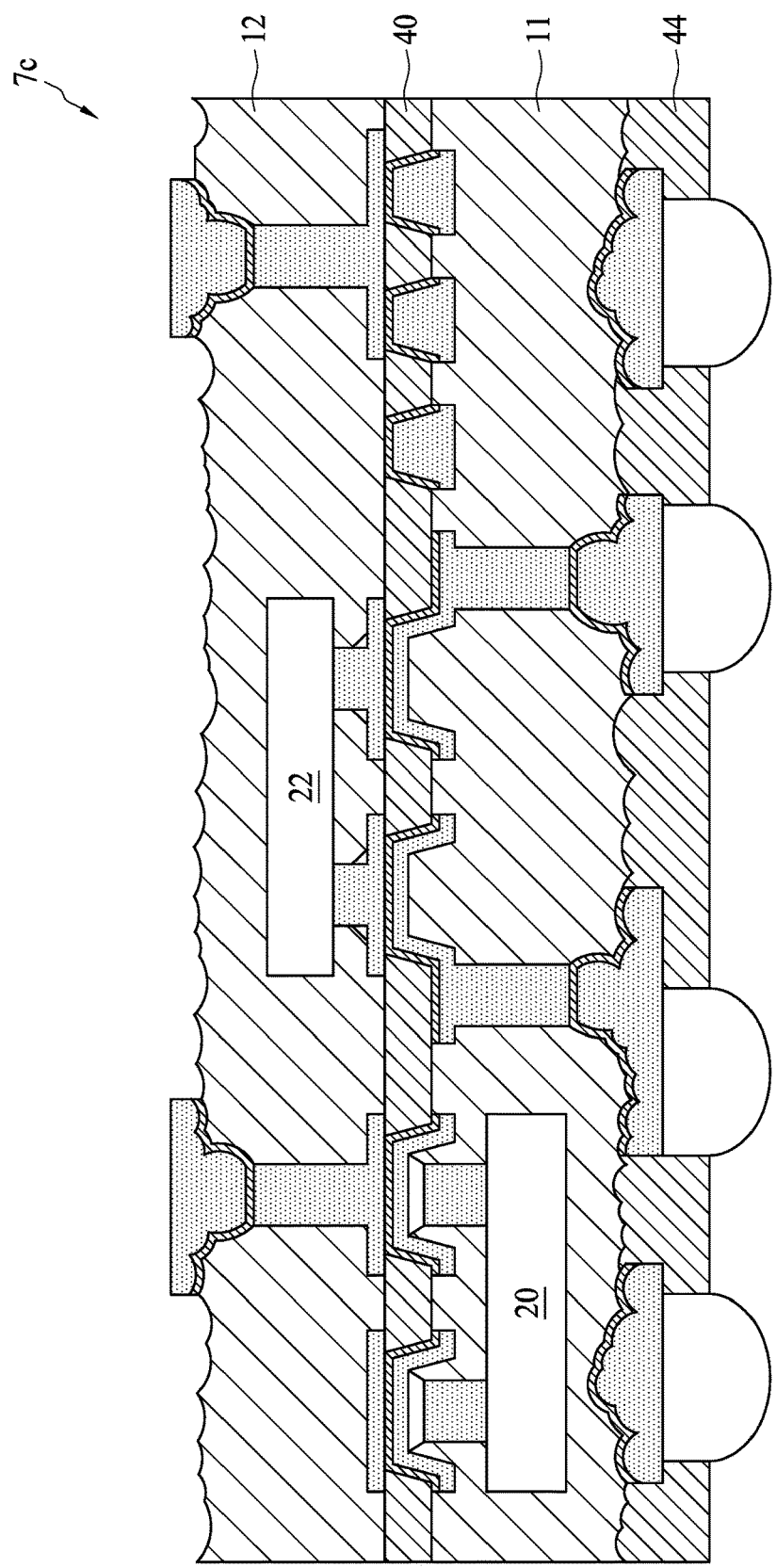

FIG. 10A and FIG. 10B are cross-sectional views of semiconductor packages 7a and 7c in accordance with some embodiments of the present disclosure. The semiconductor packages 7a and 7c are similar to the semiconductor package 1 of FIG. 1 in certain respects, and certain details of same-numbered components are not described again with respect to FIG. 10A and FIG. 10B. Referring to FIG. 10A, a layer 100 is disposed on the top surface of the electrical component 22. The layer 100 may be a metal layer (e.g., including an alloy that includes Cu, Ni, Ti, W or Pt). The layer 100 may be a non-metal layer (e.g., a PI, an epoxy, an oxide ($SiO_x$, $SiN_x$, $TaO_x$), a glass, silicon, or a ceramic). Referring to FIG. 10B, the layer 100 may be omitted. The electrical component 22 is encapsulated by the dielectric layer 12.

Figure 11:
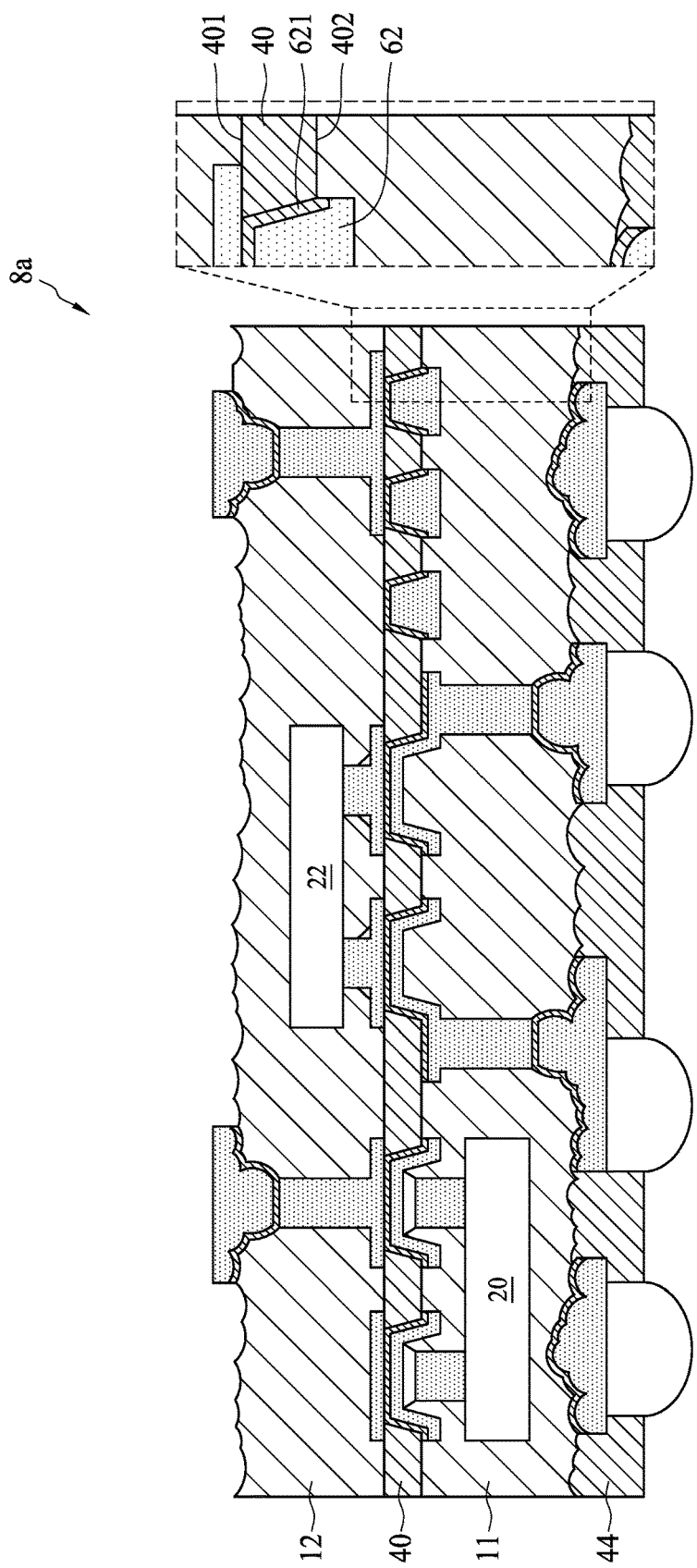
FIG. 11 is a cross-sectional view of a semiconductor package in accordance with some embodiments of the present disclosure.

FIG. 11 is a cross-sectional view of semiconductor package 8a in accordance with some embodiments of the present disclosure. The semiconductor package 8a is similar to the semiconductor package 1 of FIG. 1 in certain respects, and certain details of same-numbered components are not described again with respect to FIG. 11. The insulation layer 40 has a surface 401 and a surface 402 opposite to the surface 401. The surfaces 401 and 402 are smooth. A fine roughness interface between the dielectric layer 12 and the insulation layer 40 is formed using $O_2$ gas plasma dry-etching and/or $H_2SO_4$ liquid wet-etching.

Figure 12A:
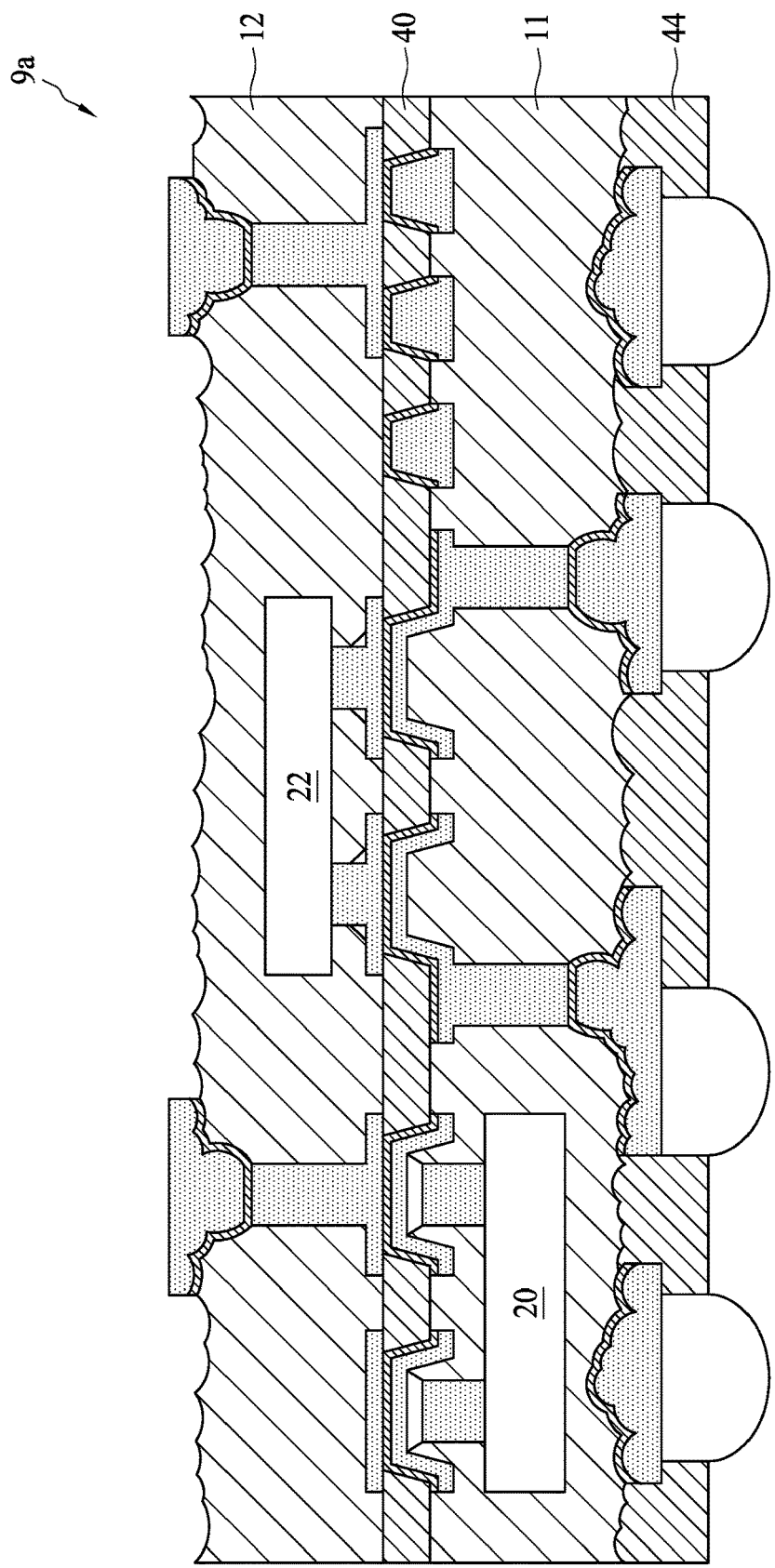
FIG. 12A and FIG. 12B are cross-sectional views of semiconductor packages in accordance with some embodiments of the present disclosure.
Figure 12B:
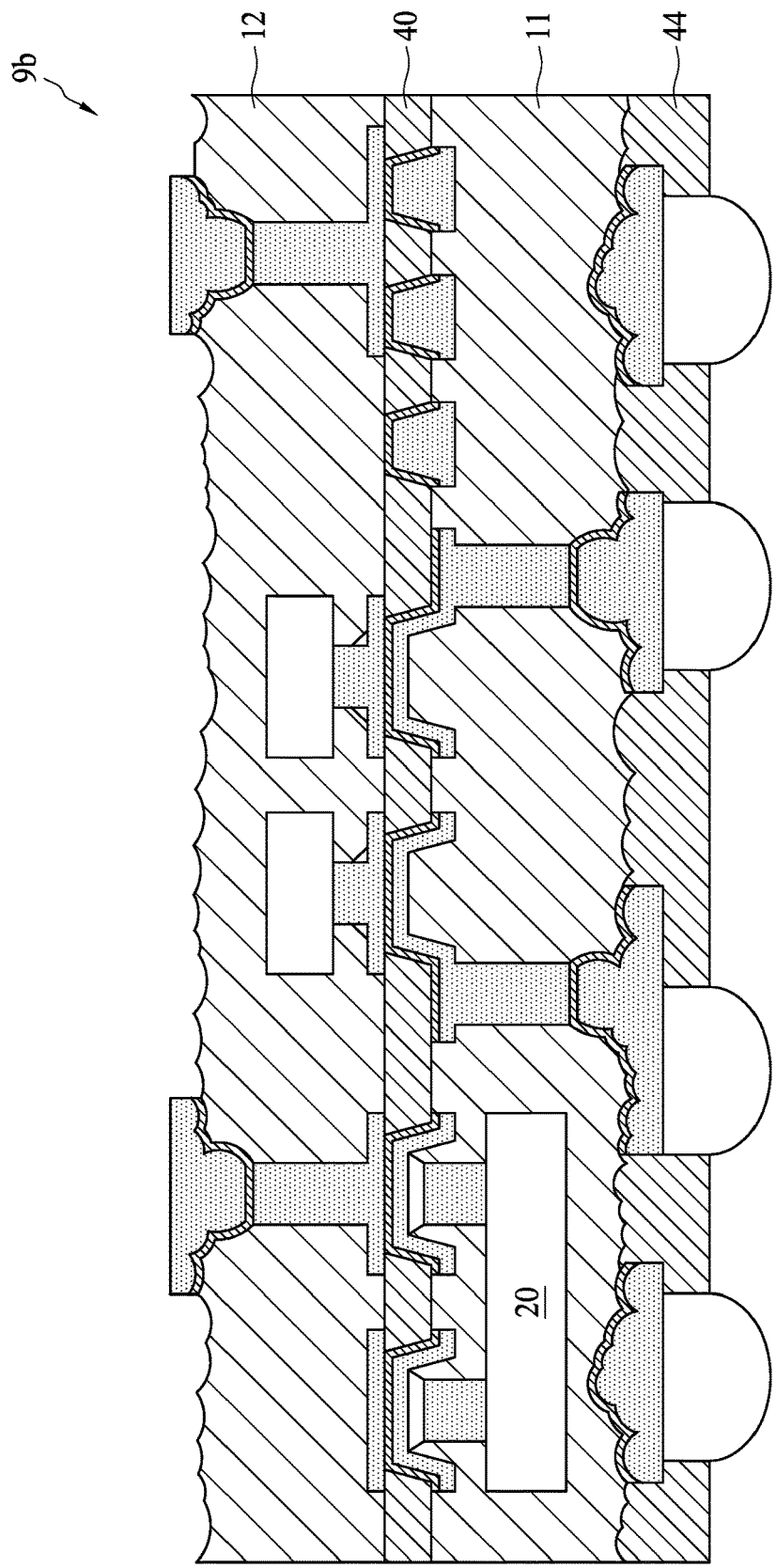

FIG. 12A through 12B are cross-sectional views of semiconductor packages 9a and 9b in accordance with some embodiments of the present disclosure. The semiconductor packages 9a and 9b are similar to the semiconductor package 1 of FIG. 1 in certain respects, and certain details of same-numbered components are not described again with respect to FIG. 12A through 12B. Referring to FIG. 12A, the upper electrical component 22 is attached to the insulation layer 40. Referring to FIG. 12B, two upper electrical components are attached to the insulation layer 40.

Figure 13A:
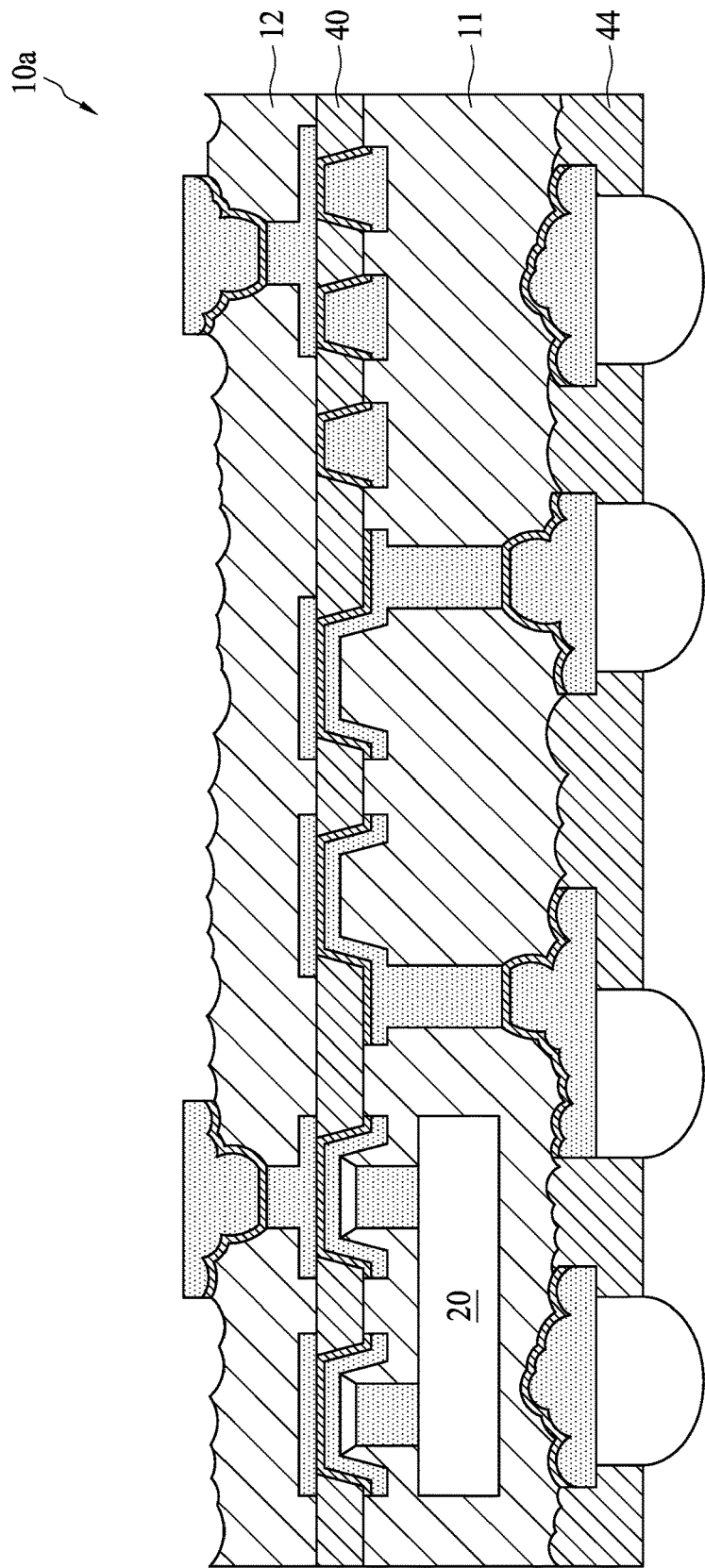
FIG. 13A, FIG. 13B, FIG. 13C, and FIG. 13D are cross-sectional views of semiconductor packages in accordance with some embodiments of the present disclosure.
Figure 13B:
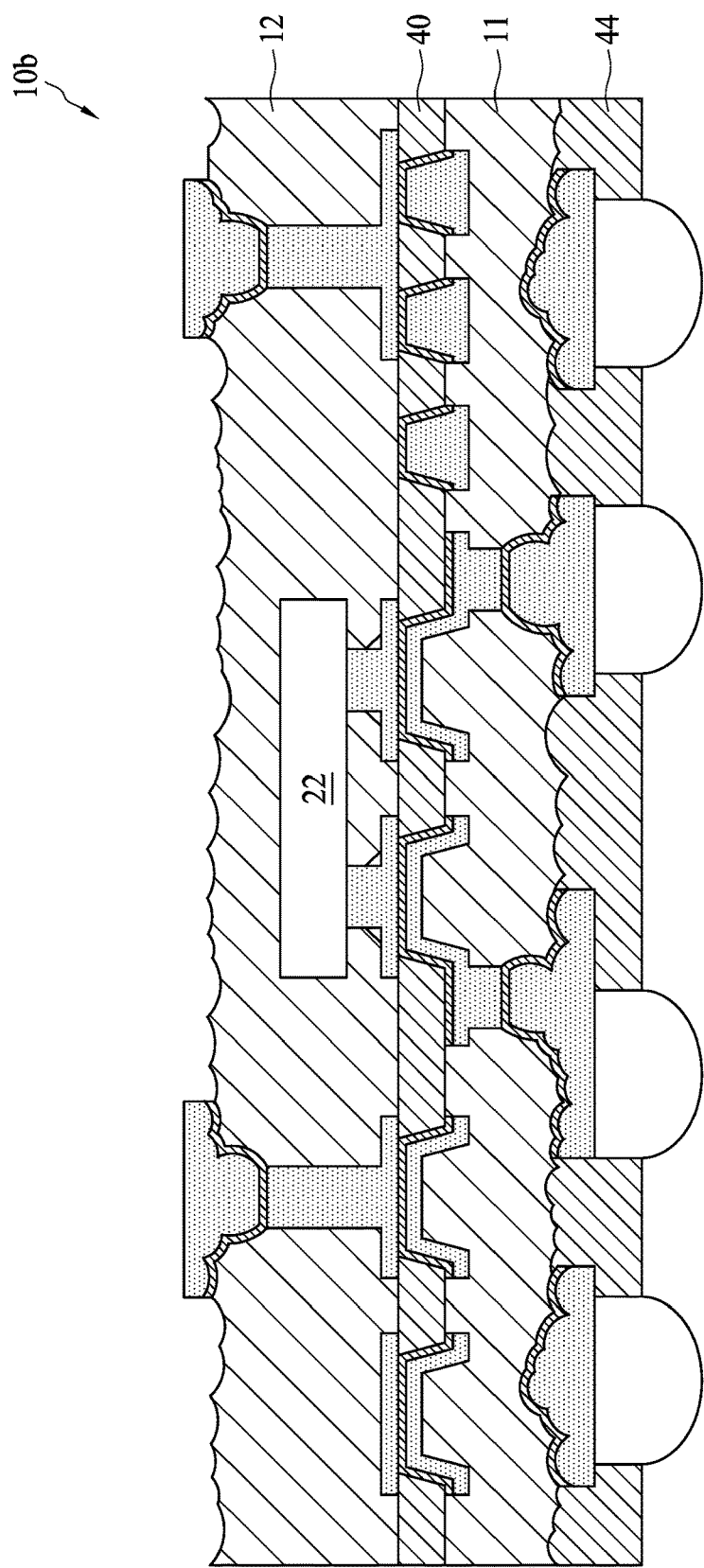
Figure 13C:
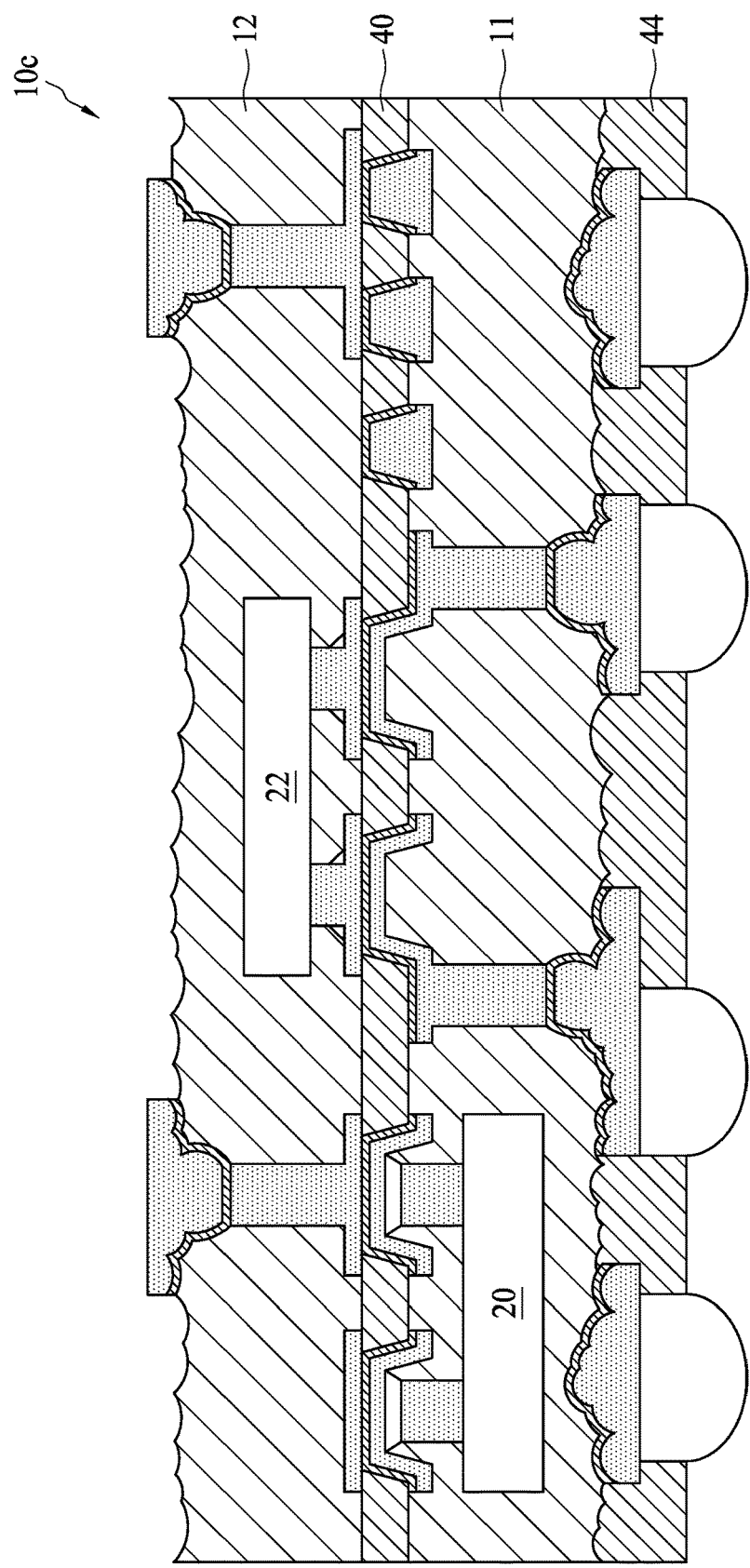
Figure 13D:
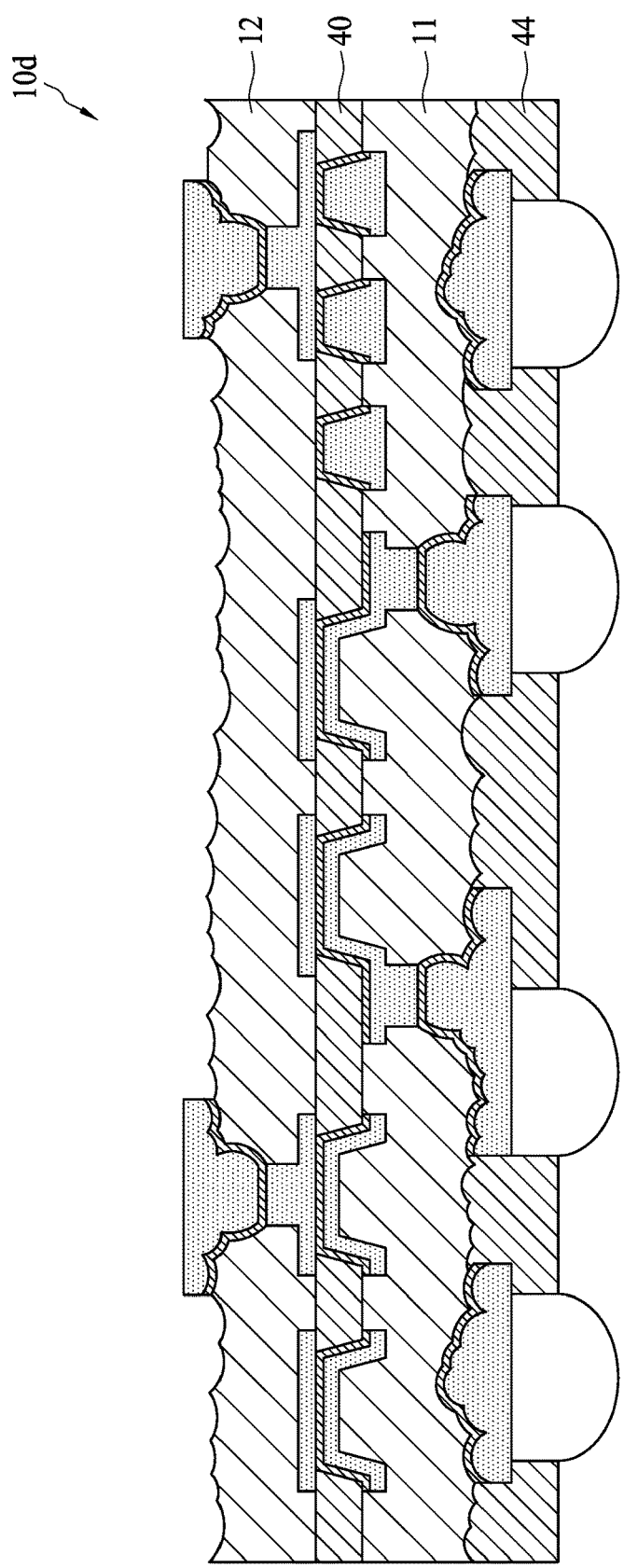

FIG. 13A through 13D are cross-sectional views of semiconductor packages 10a through 10d in accordance with some embodiments of the present disclosure. The semiconductor packages 10a through 10d are similar to the semiconductor package 1 of FIG. 1 in certain respects, and certain details of same-numbered components are not described again with respect to FIG. 13A through 13D. Referring to FIG. 13A, an upper electrical component is omitted. An electrical component 20 is attached to the insulation layer 40. Referring to FIG. 13B, a lower electrical component is omitted. An electrical component 22 is attached to the insulation layer 40. Referring to FIG. 13C, two electrical components 20 and 22 attached to the insulation layer 40. Referring to FIG. 13D, no electrical components are attached to the insulation layer 40.

Figure 14B:
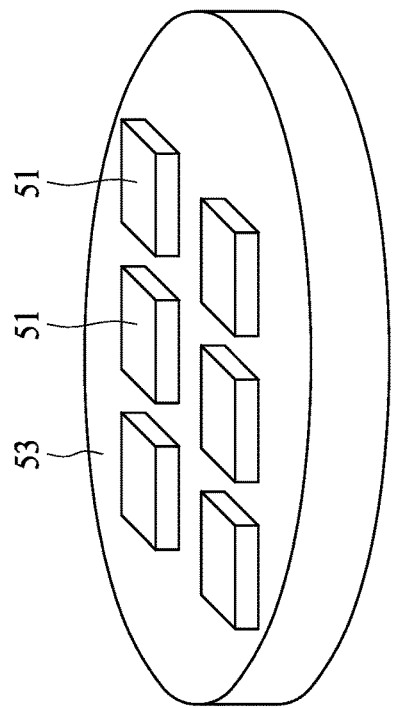
FIG. 14A and FIG. 14B illustrate different types of semiconductor packages in accordance with some embodiments of the present disclosure.
Figure 14A:
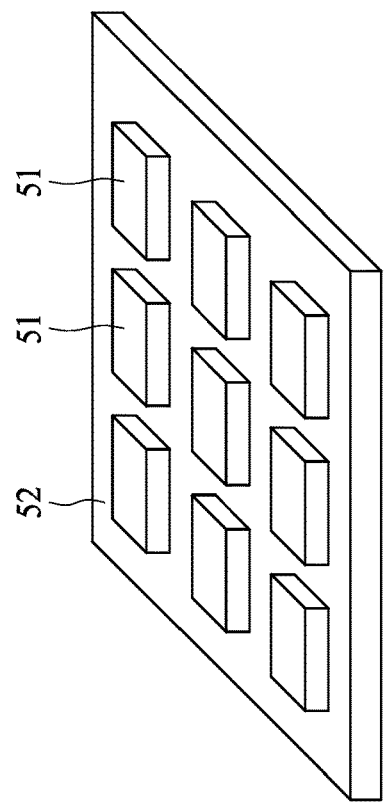

FIG. 14A and FIG. 14B illustrate different types of semiconductor packages in accordance with some embodiments of the present disclosure.

As shown in FIG. 14A, a plurality of chips 51 or dies are placed on a substantially square-shaped carrier 52 (e.g. in accordance with one or more embodiments described herein). In some embodiments, the carrier 52 may include organic materials (e.g., a molding compound, BT, a PI, PBO, a solder resist, an ABF, PP or an epoxy-based material) and/or inorganic materials (e.g., silicon, a glass, a ceramic, or quartz).

As shown in FIG. 14B, a plurality of chips 51 or dies are placed on a substantially circle-shaped carrier 53 (e.g. in accordance with one or more embodiments described herein). In some embodiments, the carrier 53 may include organic materials (e.g., a molding compound, BT, a PI, PBO, a solder resist, an ABF, PP or an epoxy-based material) and/or inorganic materials (e.g., silicon, a glass, a ceramic, or quartz).

Figure 15:
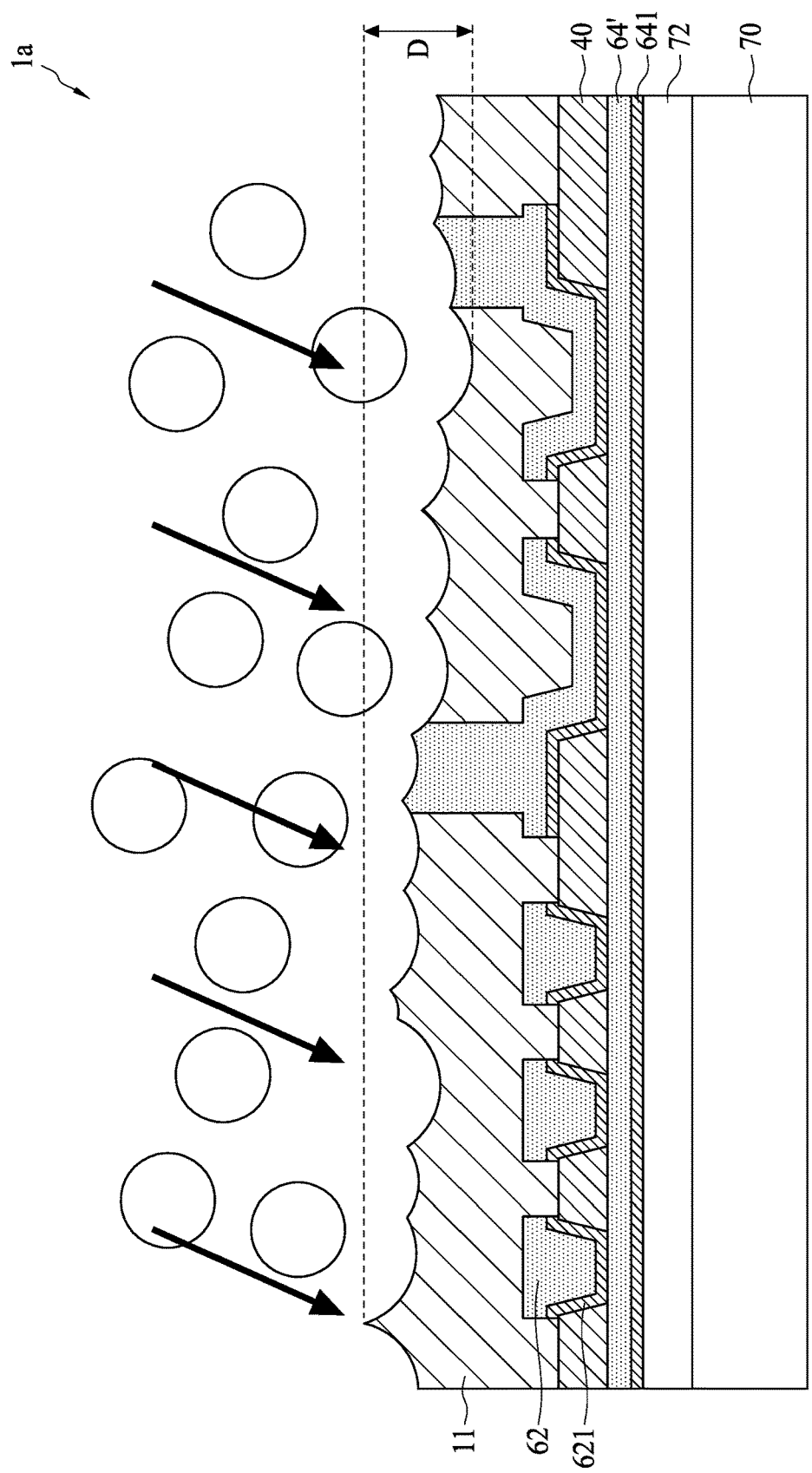
FIG. 15 is a cross-sectional view of a semiconductor package in accordance with some embodiments of the present disclosure.

FIG. 15 is a cross-sectional view of a semiconductor package 1a in accordance with some embodiments of the present disclosure. In some embodiments, a difference D between a highest point of a top surface of the dielectric layer 11 and a lowest point of the top surface of the dielectric layer 11 is between about 10 μm and about 20 μm.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be substantially aligned or coplanar if a displacement between the two surfaces is no greater than 0.5 μm, no greater than 1 μm, no greater than 5 μm, no greater than 10 μm, or no greater than 15 μm. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
    a dielectric layer having a first surface and a second surface opposite to the first surface; and
    a conductive post disposed in the dielectric layer, the conductive post comprising a first portion and a second portion disposed above the first portion, the second portion of the conductive post being recessed from the second surface of the dielectric layer,
    wherein the second surface of the dielectric layer has an arithmetic average surface roughness (Ra) value, and wherein the Ra value is greater than approximately 450 nanometers (nm).

2. The semiconductor package of claim 1, wherein the dielectric layer defines a tapered opening adjacent to the second portion of the conductive post.

3. The semiconductor package of claim 2, further comprising a first patterned conductive layer extended into the tapered opening and in contact with the second portion of the conductive post.

4. The semiconductor package of claim 3, wherein the first patterned conductive layer comprises a first sublayer and a second sublayer, the first sublayer layer disposed between the second sublayer and the second portion of the conductive post.

5. The semiconductor package of claim 3, further comprising a second patterned conductive layer electrically connected to the first portion of the conductive post.

6. The semiconductor package of claim 5, wherein the second patterned conductive layer comprises a sublayer, the sublayer of the second patterned conductive layer including titanium (Ti).

7. The semiconductor package of claim 5, further comprising a first electrical component, the first electrical component embedded in the dielectric layer and disposed between the first patterned conductive layer and the second patterned conductive layer.

8. The semiconductor package of claim 1, wherein the dielectric layer includes a molding material.

9. The semiconductor package of claim 1, wherein the Ra value is less than approximately 12 micrometers (μm).

10. The semiconductor package of claim 9, wherein the dielectric layer has a sidewall that defines a tapered opening adjacent to the second portion of the conductive post, wherein the sidewall of the dielectric layer has an Ra value substantially the same as the Ra value of the second surface of the dielectric layer.

11. The semiconductor package of claim 1, wherein the Ra value is in a range from approximately 3 μm to approximately 10 μm.

12. A semiconductor package, comprising:
    a dielectric layer having a first surface and a second surface opposite to the first surface, wherein the second surface of the dielectric layer has an arithmetic average surface roughness (Ra) value, and wherein the Ra value is greater than approximately 450 nanometers (nm);
    a conductive post disposed in the dielectric layer, wherein the dielectric layer defines a tapered opening adjacent to the conductive post; and
    a patterned conductive layer extending into the tapered opening and in contact with the conductive post.

13. The semiconductor package of claim 12, wherein the patterned conductive layer comprises a first sublayer and a second sublayer, the first sublayer layer disposed between the second sublayer and the conductive post.

14. The semiconductor package of claim 12, further comprising an electrical component, the electrical component embedded in the dielectric layer.

15. The semiconductor package of claim 12, wherein the dielectric layer comprises a molding material.

16. The semiconductor package of claim 12, wherein the Ra value is less than approximately 12 micrometers (μm).

17. The semiconductor package of claim 16, wherein the dielectric layer has a sidewall that defines the tapered opening adjacent to the conductive post, and the sidewall of the dielectric layer has an Ra value substantially the same as the Ra value of the second surface of the dielectric layer.

18. The semiconductor package of claim 12, wherein the Ra value is in a range from approximately 3 μm to approximately 10 μm.

\* \* \* \* \*